(12) United States Patent
Murade

(10) Patent No.: US 6,885,417 B2
(45) Date of Patent: Apr. 26, 2005

(54) ELECTRO-OPTICAL APPARATUS AND ELECTRONIC EQUIPMENT

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 162 days.

(21) Appl. No.: 10/435,037

(22) Filed: May 12, 2003

(65) Prior Publication Data

US 2004/0017628 A1 Jan. 29, 2004

(30) Foreign Application Priority Data

May 21, 2002 (JP) ........................................ 2002-146434
Apr. 16, 2003 (JP) ........................................ 2003-111529

(51) Int. Cl.⁷ .......................................... G02B 1/1333
(52) U.S. Cl. ........................... 349/111; 349/44; 349/110
(58) Field of Search ........................... 345/245; 349/41, 349/42, 44, 110, 111; 257/294

(56) References Cited

U.S. PATENT DOCUMENTS

| | | | | |
|---|---|---|---|---|
| 5,861,928 A | * | 1/1999 | Sekiguchi | 349/49 |
| 6,297,862 B1 | * | 10/2001 | Murade | 349/44 |
| 6,388,721 B1 | * | 5/2002 | Murade | 349/44 |
| 6,610,997 B1 | * | 8/2003 | Murade | 257/72 |
| 6,703,997 B1 | * | 3/2004 | Murade | 345/92 |
| 6,809,787 B1 | * | 10/2004 | Seo et al. | 349/129 |
| 2003/0122125 A1 | * | 7/2003 | Murade | 257/59 |
| 2003/0122157 A1 | * | 7/2003 | Murade | 257/200 |
| 2003/0122158 A1 | * | 7/2003 | Murade | 257/200 |
| 2003/0137622 A1 | * | 7/2003 | Song | 349/110 |
| 2003/0234971 A1 | * | 12/2003 | Murade | 359/315 |
| 2004/0004221 A1 | * | 1/2004 | Murade | 257/72 |
| 2004/0046902 A1 | * | 3/2004 | Yamasaki | 349/43 |
| 2004/0135940 A1 | * | 7/2004 | Tsunekawa et al. | 349/139 |
| 2004/0135952 A1 | * | 7/2004 | Kurashina et al. | 349/139 |
| 2004/0141097 A1 | * | 7/2004 | Takahara et al. | 349/38 |
| 2004/0141130 A1 | * | 7/2004 | Kawata et al. | 349/139 |

FOREIGN PATENT DOCUMENTS

| | | | | | |
|---|---|---|---|---|---|
| JP | 08101399 A | * | 4/1996 | ........... | G02F/1/136 |
| JP | A 2002-90721 | | 3/2002 | | |

* cited by examiner

*Primary Examiner*—Ricky Mack
(74) *Attorney, Agent, or Firm*—Oliff & Berridge, PLC

(57) ABSTRACT

A pixel electrode and a thin film transistor connected to the electrode are provided above one substrate. A shading film is provided above another substrate. The shading film has an overhanging portion defining a corner cutting in an opening area of each pixel in the crossing area where the data line and the scan line cross with each other. A channel region of the thin film transistor is arranged in the crossing areas. Thus, light resistance is enhanced and a high-grade image is displayed in an electro-optical apparatus.

16 Claims, 16 Drawing Sheets

(a)

(b)

(a)

(b)

ELECTRO-OPTICAL APPARATUS AND ELECTRONIC EQUIPMENT

BACKGROUND OF THE INVENTION

1. Field of Invention

The present invention relates to an active-matrix driving type of electro-optical apparatus and electronic equipment. More particularly, the invention relates to an electro-optical apparatus where a thin film transistor to provide pixel switching (hereinafter "TFT") is provided in a stacked structure on a substrate. The invention further relates to electronic equipment including the electro-optical apparatus, such as a projector.

2. Description of Related Art

In an electro-optical apparatus, such as a TFT active-matrix driving type of liquid crystal apparatus and EL (Electro-luminescence) display apparatus, when an incident light is irradiated on a channel region of the TFT to switch the pixel provided in each pixel, a photo-induced leakage current is generated by light excitation and a characteristic of the TFT is changed thereby. Particularly, in case of an electro-optical apparatus for a light valve of the projector, since the intensity of the incident light is strong, it is important to shade the incident light for the channel region of the TFT and its adjacent region.

Therefore, in the related art, in each pixel provided on a counter substrate, such a channel region and its adjacent region are configured to be shaded by a shading film defining an opening area where the light contributing to display transmits or reflects, or a data line which passes above the TFT and comprises a metal film, such as Al (aluminum). Further, in some cases, a shading film including, for example, a high-melting-point metal may be provided also on an underside of the TFT to switch the pixel on a TFT array substrate. When the shading film is also provided on the underside of the TFT in this way, it can be prevented that a back reflection light from the TFT array substrate side, or a return light, such as a projection light coming through a prism from other electro-optical apparatus when plural number of electro-optical apparatus are combined with each other through prisms to form an optical system, is injected to the TFT of that electro-optical apparatus.

SUMMARY OF THE INVENTION

However, the above various shading techniques are subject to the following problems.

That is, first, according to the technique of forming the shading film on the counter substrate or TFT array substrate, the shading film is considerably separated from the channel region via, for example, a liquid crystal layer, electrode, and interlayer isolation film as viewed in a three-dimensional way, and thus shading against the light injected at oblique angle between the both is insufficient. Particularly, in a small electro-optical apparatus for use as the light valve of the projector, the incident light is a luminous flux formed by converging light from a source by a lens, and contains an optic element injected at oblique angle significantly. For example, in some cases, an optic element inclined 10 to 15 degrees from a direction vertical to the substrate may be contained about 10% in the incident light, therefore such insufficient shading against the incident light injected at oblique angle is a practical problem.

In addition, in some cases, light entered from a region without the shading film into the electro-optical apparatus is reflected on the substrate or a top of the shading film and the data line formed on the substrate, and then such reflection light or a multiple reflection light, caused by further reflection of the light on the substrate or on the shading film or data line, eventually may reach the channel region of the TFT.

Particularly, in an attempt to achieve a higher definition or a finer pixel pitch in the electro-optical apparatus in order to enhance a display image grade, and in an attempt to increase an intensity of the incident light in order to achieve a brighter image display, the related art, various shading techniques encounter more difficulty in providing the sufficient shading, and a problem occurs that the change of the characteristic of the transistor of the TFT causes flicker and leads to lowering of the display image grade.

To enhance the light resistance, although it is simply considered to be enough to broaden the area to form the shading film, in this case, it is essentially difficult to increase an open area ratio of each pixel. Therefore a problem occurs that the display image becomes dark.

The invention addresses or solves the above and/or other problems, and provides an electro-optical apparatus including an excellent light resistance and capability of displaying a bright, high-grade image, and an electronic equipment including the electro-optical apparatus.

To address or solve the above, the electro-optical apparatus of the invention includes an electro-optical material sandwiched between a pair of a first and second substrates, a pixel electrode, a thin film transistor to switch and control the pixel electrode, a data line to supply an image signal to the thin film transistor, and a scan line which supplies a scan signal to the thin film transistor and crosses with the data line, above the first substrate, and having a first shading film covering at least a channel region of a semiconductor layer forming the thin film transistor from upside, above the second substrate. The first shading film has an overhanging portion overhanging such that the portion defines a corner cutting in an opening area of each pixel corresponding to the pixel electrode in a crossing area where the data line and scan line cross with each other as viewed in a two-dimensional way, and the channel region is arranged within the crossing area.

According to the electro-optical apparatus of the invention, during operation, for example, the image signal is supplied to a source of the thin film transistor through the data line, and the scan signal is supplied to a gate of the thin film transistor through the scan line. Then, for example, by switching and controlling the pixel electrode connected to a drain of the thin film transistor using the thin film transistor, the active-matrix driving type of driving can be achieved. Above the second substrate, for example, a counter electrode, oppositely arranged with the pixel electrode, is provided, and the voltage is applied between the counter electrode and the pixel electrode. Alternatively, in a case of the lateral electric-field driving method, the counter electrode is unnecessary, and the voltage is applied between the pixel electrodes adjacent with each other.

Since at least the channel region of the semiconductor layer forming the thin film transistor and its adjacent region are covered by the first shading film formed above the second substrate from the upside, an incident light from the upside with respect to a substrate surface can be essentially prevented from injecting to the channel region of the thin film transistor and its adjacent region.

Particularly, the first shading film has the overhanging portion overhanging such that the pattern defines the corner cutting in the opening area of each pixel in the crossing area where the data line and scan line cross with each other. For example, when a quadrilateral opening area is considered as a standard, 1 to 4 of the corner cuttings are provided, and the opening areas in a pentagon to octagon shape are defined. The channel region is arranged within the crossing area having such corner cutting. Therefore, compared to a case without the overhanging portion, by using the first shading film having the overhanging portion, a strong incident-light which advances vertically or obliquely from the upside with respect to the substrate surface, and an internal reflection light and multiple reflection light based on the incident light, can be effectively reduced or prevented from injecting to the channel region of the thin film transistor and its adjacent region.

As a result, the unevenness of display or flicker caused by the light-induced leakage current or variation in the thin film transistor can be efficiently reduced with the open area ratio of each pixel being increased, and eventually a bright high-grade image can be displayed.

In another exemplary embodiment of the electro-optical apparatus of the invention, the channel region is arranged in the center of the crossing area.

In this exemplary embodiment, the channel region is arranged in the center of the crossing area, and particularly, separated from the opening area of each pixel through which light passes with some distance because of the presence of corner cutting. Therefore, a shading performance for the channel region can be efficiently enhanced. The meaning of the phrase "arranged in the center of the crossing area" includes a case that the channel region locates near to the center point in a greater or smaller extent from the border of the crossing area within the area, in addition to the case that a center point of the channel region corresponds with the center point of the crossing area, such as a centroid.

In another exemplary embodiment of the electro-optical apparatus of the invention, a micro-lens arranged oppositely to the pixel electrode is further provided above the second substrate, and the first shading film is formed in a region opposed to the crossing area.

According to the exemplary embodiment, the incident light is introduced near to the center of the opening area of each pixel through the micro-lens. Here, particularly, the incident light, injected to four corners near to a boundary of the micro-lens aligned in an array pattern, is hardly converged appropriately or cannot be converged appropriately because of the property of the lens. However, since the overhanging portion can shade the optic element that is not converged appropriately by the micro-lens, enhancement of the image quality can be expected with the brightness being maintained.

In another exemplary embodiment of the electro-optical apparatus of the invention, the first shading film is formed individually in the crossing area in an island pattern.

According to the exemplary embodiment, the first shading film that is formed in the crossing area in the island pattern and has the overhanging portion can exclusively shade the channel region and its adjacent region. Particularly, according to such island pattern configuration, a total area of the shading film formed above the second substrate can be reduced, therefore it is effectively prevented that the opening area of each pixel is reduced by a misalignment in bonding the first and second substrates together during fabrication. Also, generation of stress caused by the first shading film in the second substrate can be reduced by forming the film in the island pattern.

Alternatively, in another exemplary embodiment of the electro-optical apparatus of the invention, the first shading film is formed in a striped pattern area extending along the scan line or the data line including the crossing area.

According to the exemplary embodiment, the first shading film, which is formed in the stripe pattern area including the crossing area and has the overhanging portion, enhances the shading performance for the channel region and its adjacent region locally. Moreover, the entire stripe-pattern area along the scan line or data line can be also shaded, and the first shading film can also define the area along the scan line or data line within the unopened array-pattern area of each pixel.

Alternatively, in another exemplary embodiment of the electro-optical apparatus of the invention, the first shading film is formed in an array pattern area extending along the scan line and the data line including the crossing area.

According to the exemplary embodiment, the first shading film, which is formed in the array-pattern area including the crossing region and has the overhanging portion, improves the shading performance for the channel region and its adjacent region locally. Moreover, the entire array-pattern area along the scan line and data line can be also shaded, and the first shading film can also define all of the unopened area of each pixel.

In another exemplary embodiment of the electro-optical apparatus of the invention, an upside shading film covering at least the channel region from the upside is further provided above the first substrate.

According to the exemplary embodiment, by the first shading film and upside shading film, the incident light from the upside with respect to the substrate surface, the internal reflection light or multiple reflection light arising from the incident light, can be prevented more securely from injecting to at least the channel region of the thin film transistor. Also, the unopened area of each pixel can be defined by the first shading film only, or by both of the first and upside shading films.

The upside shading film may be combined with a capacitor electrode of a fixed potential side to form a storage capacitor connected to the pixel electrode, or a capacitance line including the capacitor electrode at the fixed potential side. Alternatively, it may be combined with a capacitor electrode of a pixel potential side of the storage capacitor. Also, both of the capacitor electrode at the fixed potential side and the capacitor electrode at the pixel potential side can be formed from a conductive shading film.

In the exemplary embodiment, the upside shading film may have the overhanging portion overhanging such that the portion defines the corner cutting in the crossing area.

According to the configuration, the channel region and its adjacent region can be shaded doubly at a position, separated from the opening area of each pixel through which light passes, by the overhanging portion of the upside shading film, in addition to the overhanging portion of the first shading film, therefore the shading performance for the regions can be further enhanced.

Alternatively, in the exemplary embodiment according to the upside shading film, a two-dimensional pattern of the first shading film may be configured, such that the pattern covers a two-dimensional pattern of the upside shading film in the crossing area.

According to the configuration, it is efficiently prevented that an incident light having a stronger intensity than the normal return light passes through the side of the first shading film and reflects on a top of the upside shading film to generate the internal reflection light or this can be reduced. Also, the first shading film formed at the second substrate side can define part or all of the unopened area of each pixel. Even if the misalignment occurs in bonding the first and second substrates together during fabrication, reduction of the opening area can be effectively blocked by the presence of the upside shading film.

Alternatively, in the exemplary embodiment according to the upside shading film, the two-dimensional pattern of the first shading film may be configured, such that the pattern is formed smaller than the two-dimensional pattern of the upside shading film in the crossing area.

According to the configuration, the upside shading film can define a part or all of the unopened area of each pixel above the first substrate. Even if the misalignment occurs in bonding the first and second substrates together during fabrication, the reduction of the opening area can be effectively blocked by the presence of the first shading film. In this case, the first shading film functions mainly to shade the channel region and its adjacent region, and particularly functions for reducing the heat generated within that electro-optical apparatus by shading only at the first substrate side.

In another exemplary embodiment of the electro-optical apparatus of the invention, a downside shading film covering the channel region and its adjacent region from a downside is further provided above the first substrate.

According to the exemplary embodiment, the channel region of the semiconductor layer forming the thin film transistor and its adjacent region are covered from the downside by the downside shading film, therefore, a return light from the downside with respect to the substrate surface, an internal reflection light or multiple reflection light based on the return light, can be reduced or essentially prevented from injecting to the channel region of the thin film transistor and its adjacent region. Here, the word "return light" is a light that is a noncontributing to display which returns in a direction opposite to the incident light, such as back reflection on the substrate, or a light which is emitted from another light valve in a multiple-plate projector using plural number of those electro-optical apparatus as light valves, and passes through a composite optical system.

In addition, the downside shading film makes it possible to define a part or all of the unopened area of each pixel above the first substrate.

In the exemplary embodiment, the downside shading film may have the overhanging portion overhanging such that the portion defines the corner cutting in the crossing area.

According to the configuration, compared to a case without the overhanging portion in that downside shading film, by the downside shading film having the overhanging portion, a return light which advances from the downside vertically or obliquely with respect to the substrate surface, an internal reflection light and multiple reflection light arising from the return light, can be effectively reduced or prevented from injecting to the channel region of the thin film transistor and its adjacent region.

In the exemplary embodiment according to the downside shading film, a two-dimensional pattern of the downside shading film may be configured such that the pattern is somewhat smaller in the crossing area than the two-dimensional pattern of the upside shading film.

According to the configuration, it is reduced or efficiently prevented that the incident light having a stronger intensity than the normal return light passes through the side of the upside shading film and reflects on a top of the downside shading film to generate the internal reflection light.

However, in the exemplary embodiment according to the downside shading film, the two-dimensional pattern of the downside shading film may be configured, such that the pattern is somewhat larger in the crossing area than the two-dimensional pattern of the upside shading film. Also, in the exemplary embodiment according to the downside shading film, the two-dimensional pattern of the downside shading film may be configured, such that the pattern is somewhat smaller or larger in the crossing area than the two-dimensional pattern of the first shading film.

In another exemplary embodiment of the electro-optical apparatus of the invention, among the four corners of the opening area, the overhanging portion is provided in at least one or plural number of corners where malfunction of the electro-optical material is comparatively serious.

According to the exemplary embodiment, the corner cutting is defined for a corner having the serious malfunction of the electro-optical material layer, such as a bad orientation of the liquid crystal layer. Therefore, in a case that the malfunction does not occur evenly in the four corners, such as a case that the bad orientation of the liquid crystal layer does not occur evenly in the four corners in relation to rubbing direction, that malfunctioned area is masked positively. Accordingly, a contrast ratio is efficiently enhanced by preventing a light escape in the corner of each opening area. At the same time, since a normal or substantially normal operation is performed in a corner in which the malfunction is not serious, the corner is not masked and used as part of the opening area, thereby reduction of the open area ratio of each pixel due to the presence of the overhanging portion can be restrained.

The overhanging portion may be provided one, two, or three for one opening area depending on an occurrence site or degree of the malfunction.

Alternatively, in another exemplary embodiment of the electro-optical apparatus of the invention, the overhanging portions, each of them being symmetric vertically and horizontally, are provided in the four corners of the opening area respectively.

According to the exemplary embodiment, the overhanging portions, each of them being symmetric vertically and horizontally, are provided in the four corners of the opening area respectively, and a two-dimensional pattern of the opening area of each pixel is close to a circle or polygon shape compared with that in a case without the overhanging portion. As a result, the opening area having the two-dimensional pattern close to the circle or polygon shape can be used to display an excellent image having a reduced light-escape region or malfunctioned region in each opening area. Particularly, when the configuration is employed in case that a micro-lens having a circular or substantially circular pattern is used, the configuration is very effective because an appropriately converged incident light can be passed through the opening area, and an inappropriately converged incident light can be shaded.

The electro-optical apparatus of the invention has the electro-optical material sandwiched between a pair of the first and second substrates, the pixel electrode, thin film transistor to switch and control the pixel electrode, data line to supply the image signal to the thin film transistor, and scan line which supplies the scan signal to the thin film transistor and crosses with the data line above the first substrate, and has the first shading film covering at least the channel region of the semiconductor layer forming the thin film transistor from the upside above the second substrate, and the first shading film has the shading area to shade the corner of the pixel electrode in the crossing area where the data line and the scan line cross with each other as viewed in a two-dimensional way, and the channel region is preferably arranged within the crossing area.

The electro-optical apparatus of the invention may be constructed, for example, as the liquid crystal apparatus, or the EL (electro luminescence) display apparatus.

To address or solve the above, the electronic equipment of the invention includes the electro-optical apparatus of the invention. (various other exemplary embodiments are also included.)

Since the electronic equipment of the invention includes the electro-optical apparatus of the invention, it can realize various electronic equipment which can display a bright high-grade image, such as a projection display apparatus, a liquid crystal television, a cellular phone, a personal digital assistance, a word processor, a viewfinder type or a monitor direct-viewing type of video tape recorder, a workstation, a TV telephone, a POS terminal, and a touch screen, for example.

These effects and other advantages of the invention will be shown from the exemplary embodiments described in the following.

DETAILED DESCRIPTION OF PREFERRED EMBODIMENTS

Hereinafter, exemplary embodiments of the invention are described according to drawings. The following exemplary embodiments are exemplary embodiments in which the electro-optical apparatus of the invention is applied to the liquid crystal apparatus.

(Configuration of the pixel portion of the electro-optical apparatus)

Figure 1:
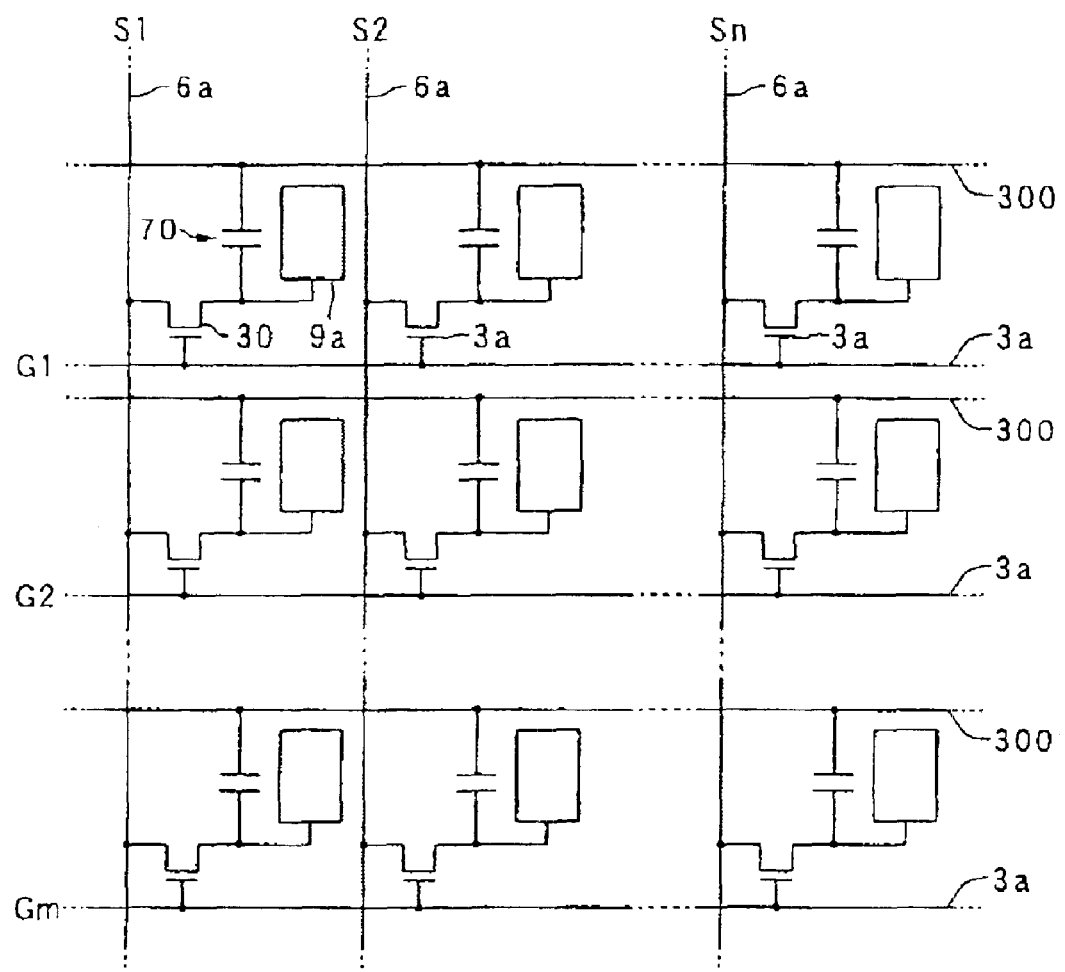
FIG. 1 is a schematic of various elements and interconnections provided on plural number of matrix pattern pixels forming an image display area in the electro-optical apparatus of an exemplary embodiment of the invention.
Figure 2:
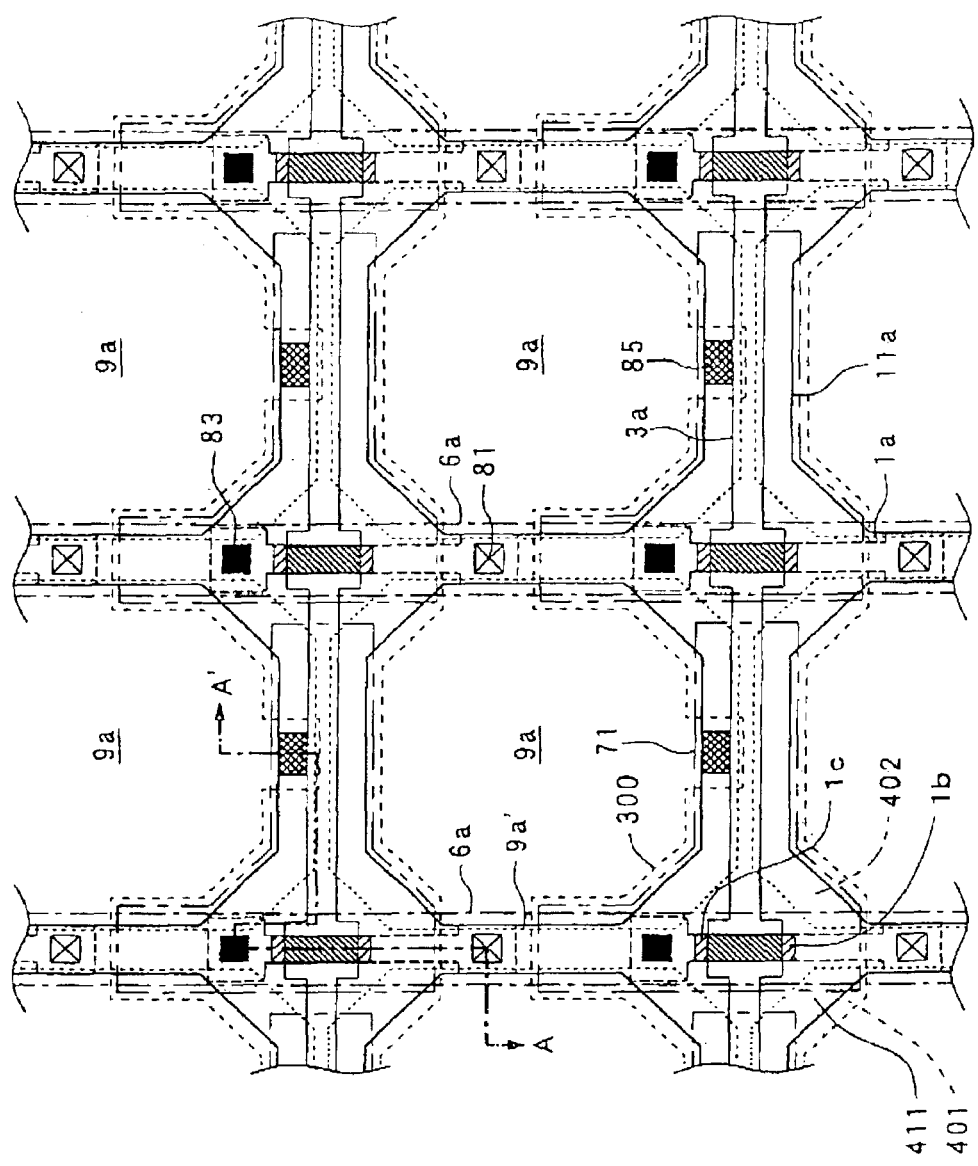
FIG. 2 is a plan view of a plural number of pixels adjacent to each other on a TFT array substrate above which a data line, scan line, and pixel electrode are formed in the electro-optical apparatus of the exemplary embodiment of the invention.
Figure 3:
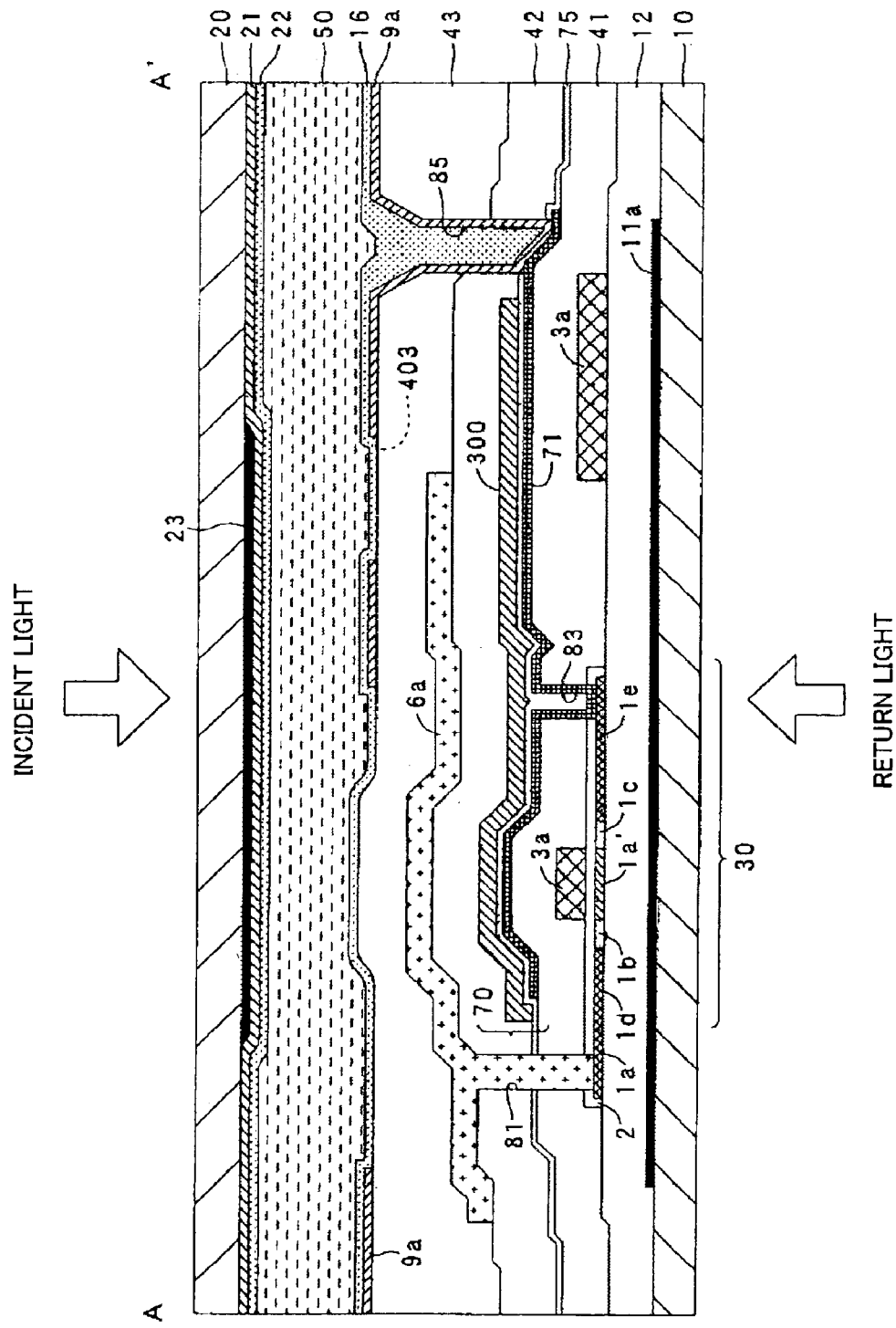
FIG. 3 is a cross-sectional view taken along plane A–A' of FIG. 2.
Figure 4:
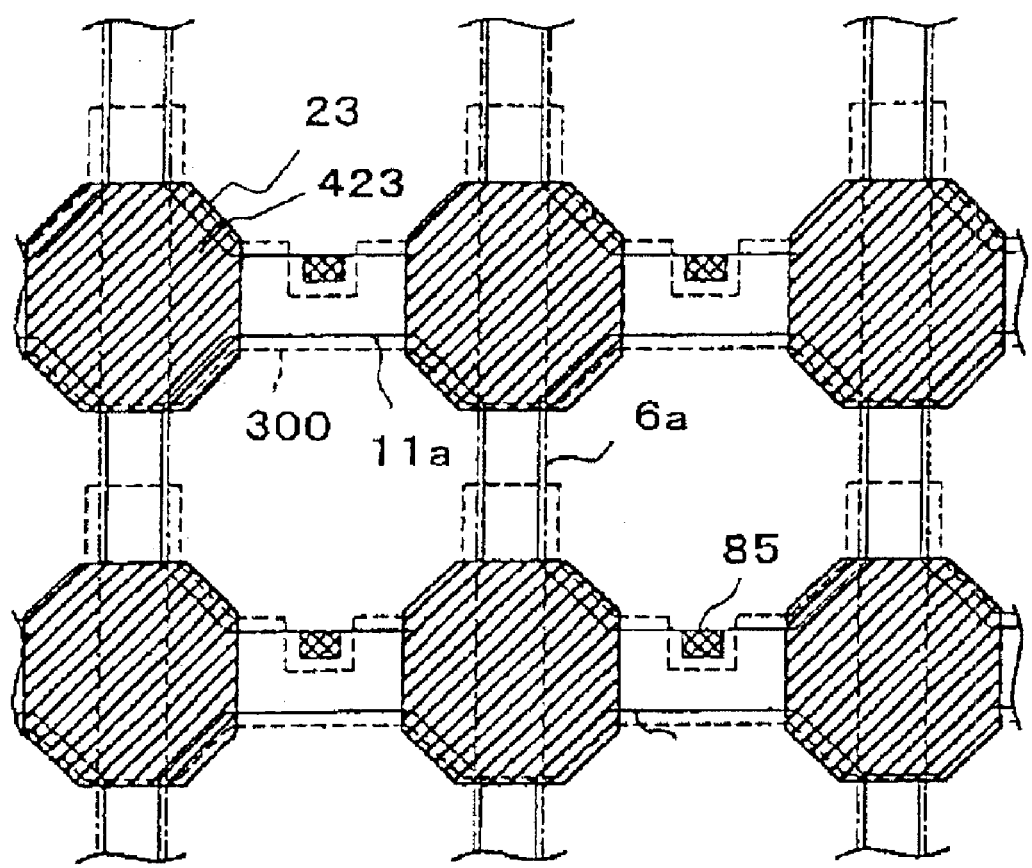
FIG. 4 is a partial plan view showing a two-dimensional-pattern of a shading film at a counter substrate side in the exemplary embodiment.

First, a configuration of the pixel portion of the electro-optical apparatus of the embodiment of the invention is described with reference to FIG. 1 to FIG. 4. FIG. 1 is a schematic of various elements and interconnections in a plural number of pixels formed in a matrix pattern forming an image display area of the electro-optical apparatus. FIG. 2 is a plan view of plural number of pixels adjacent to each other on a TFT array substrate above which a data line, a scan line, and a pixel electrode are formed. FIG. 3 is a cross-sectional view taken along plane A–A' of FIG. 2. FIG. 4 is a partial plan view showing a two-dimensional pattern of a shading film above a counter substrate in the exemplary embodiment. In FIG. 3, a scale is different for each layer or each member in order to show the layer or member in a recognizable size in the figure.

In FIG. 1, a pixel electrode 9$a$ and TFT 30 to switch and control the pixel electrode 9$a$ are formed in each of plural number of pixels formed in the matrix pattern, which forms an image display area of the electro-optical apparatus in the exemplary embodiment, and a data line 6$a$ to supply an image signal is electrically connected to a source of the TFT 30. Image signals S1 to Sn written in data lines 6$a$ may be supplied in this order in a line sequence mode, or may be supplied by a group for a plural number of data lines 6$a$ adjacent with each other. A scan line 3$a$ is electrically connected to a gate of the TFT 30, and pulsed scan signals G1 to Gm are configured to be applied in this order in a line sequence mode to the scan lines 3a at a predetermined timing. The pixel electrode 9a is electrically connected to a drain of the TFT 30, and writes the image signals S1 to Sn supplied from the data lines 6a at a predetermined-timing by closing a switch of the TFT 30, which is a switching element, for only in a fixed period. The image signals S1 to Sn having a predetermined level and written in the liquid crystal as an example of the electro-optical material through the pixel electrode 9a are held in a fixed period between the liquid crystal and a counter electrode (described below) formed above a counter substrate (described below). The liquid crystal changes orientation or order of the molecular association according to an applied voltage level, thereby modulates light and enables a gray scale. In the normally white mode, a transmittance for an incident light is decreased according to a voltage applied to each pixel as a unit, and in the normally black mode, the transmittance for the incident light is increased according to the voltage applied to each pixel as a unit, and light having a contrast according to the image signals is emitted from the electro-optical apparatus as a whole. To reduce or prevent leakage of the held image signals, a storage capacitor 70 is added parallel to a liquid crystal capacitor formed between the pixel electrode 9a and counter electrode. The storage capacitor 70 is formed between the drain region of the TFT 30 and capacitor line 300.

In FIG. 2, above the TFT array substrate of the electro-optical apparatus, a plural number of transparent pixel electrodes 9a (a profile of the electrode being indicated by dot line 9a') are provided in a matrix pattern, and the data line 6a and scan line 3a are provided along the longitudinal and lateral boundaries of the pixel electrode 9a, respectively.

The scan line 3a is arranged such that the scan line 3a is opposed to a channel region 1a' shown by a thin oblique line (directed to the upper right) area in the figure in a semiconductor layer 1a, and the scan line 3a functions as a gate electrode. Particularly in this exemplary embodiment, the scan line 3a is formed wide in a portion where it acts as the gate electrode. In this way, the TFT 30 for switching the pixel, in which the scan line 3a is arranged oppositely to the channel region 1a' as the gate electrode, is provided at each point where the scan line 3a crosses with the data line 6a.

As shown in FIG. 2 and FIG. 3, a capacitor line 300 is formed above the scan line 3a. The capacitor line 300 includes a main line portion extending in a stripe pattern along the scan line 3a in a two-dimensional view, and a projecting portion projecting vertically along the data line 6a in FIG. 2 from the main line portion at an intersection of the scan line 3a and data line 6a. The scan line 3a may be formed linearly without including the projecting portion.

The capacitor line 300, including a conductive shading film containing, for example, a metal or alloy, forms an example of the upside shading film, and in addition, functions as the capacitor electrode of the fixed potential side. The capacitor line 300 comprises a metal, alloy, metal silicide, polysilicide, and a stack of them, including at least one of high-melting point metals such as Ti (titanium), Cr (chromium), W (tungsten), Ta (tantalum), and Mo (molybdenum). The capacitor line 300 may contain any other metal, such as Al (aluminum), Ag (silver), Au (gold), or Cu (copper). Alternatively, the capacitor line 300 may have a multilayer structure, in which a first film including, for example, a conductive polysilicon film, and a second film comprising a metal silicide film containing a high-melting point metal are stacked.

On the other hand, a relay layer 71, which is arranged oppositely to the capacitor line 300 via a dielectric film 75, functions as the capacitor electrode of the pixel potential side of the storage capacitor 70, and in addition, functions as an intermediate conductive layer relaying and connecting between the pixel electrode 9a and a high-density drain region 1e of the TFT 30.

In this way, in the exemplary embodiment, the storage capacitor 70 is formed by arranging the relay layer 71 as the capacitor electrode of the pixel potential side connected to the high-density drain region 1e of the TFT 30 and the pixel electrode 9a, and the part of the capacitor line 300 as the capacitor electrode of the fixed potential side, oppositely to each other via the dielectric film 75.

Respective data lines 6a extending vertically in FIG. 2 and respective capacitor lines 300 extending horizontally in FIG. 2 are formed crosswise to each other, thereby an upside shading film in an array pattern in a two-dimensional view is formed on an upside of the TFT 30 above a TFT array substrate 10, and approximately defines an opening area of each pixel.

On the other hand, on a downside of the TFT 30 above the TFT array substrate 10, a downside shading film 11a is provided in an array pattern. The downside shading film 11a is formed by any of various metal films like the capacitor line 300.

Particularly in this exemplary embodiment, the capacitor line 300 has an overhanging portion 401 defining a corner cutting in the opening area of each pixel, in the crossing area where the scan line 3a and data line 6a crosses with each other within the array-pattern shading area. The relay layer 71 has an overhanging portion 402 such that the layer also forms a capacitor by opposing to the overhanging portion 401 defining the corner cutting. Also, the downside shading film 11a has an overhanging portion 411 defining the corner cutting in the opening area of each pixel in the crossing area. Configurations, effects, and advantages according to the overhanging portions 401, 402, and 411 are described in detail below.

In FIG. 3, the dielectric film 75 arranged between the relay layer 71 and capacitor line 300 as the capacitor electrodes, includes a silicon oxide film, such as a comparatively thin HTO film, LTO film or a silicon nitride film having a thickness of about 5 to 200 nm. From a viewpoint of enlarging the storage capacitor 70, it is preferable that the dielectric film 75 has a smaller thickness, as long as the film has a sufficient reliability.

As shown in FIG. 2 and FIG. 3, the pixel electrode 9a is electrically connected to the high-density drain region 1e in the semiconductor layer 1a via contact holes 83 and 85 by relaying the relay layer 71. When the relay layer 71 is used as a relay layer in this way, even if an interlayer distance is long, for example, about 2000 mn, two or more of series contact holes having a comparatively small diameter can connect satisfactorily between the two, while a technical difficulty in connecting between the two using a single contact hole can be avoided, and thus the open area ratio of the pixel can be increased. In addition, this serves to reduce or prevent a punch-through by etching when the contact hole is opened.

On the other hand, the data line 6a is electrically connected to a high-density source region 1d of the semiconductor layer 1a comprising, for example, a polysilicon film via a contact hole 81. The data line 6a can be relayed and connected to the high-density source region 1a by the relay layer.

The capacitor line 300 is provided extendedly from the image display area, in which the pixel electrode 9a is arranged, to a circumference of the area, and connected electrically to a constant potential source, thereby set to be a fixed potential. Such constant potential source may include a constant potential source as a positive power source or negative power source which is supplied to a scan-line driving circuit (described below) to supply the scan line signal to the scan line 3a for driving the TFT 30, or a data-line driving circuit (described below) to control a sampling circuit for supplying the image signal to the data line 6a, or a constant potential which is supplied to a counter electrode 21 above a counter substrate 20. Further, the downside shading film 11a may be provided extendedly from the image display area to the circumference of the area like the capacitor line 300 and connected to the constant potential source in order to avoid a matter that a potential valuation of the film 11a affects adversely on the TFT 30.

In FIG. 2 and FIG. 3, the electro-optical apparatus includes the transparent TFT array substrate 10 and the transparent counter substrate 20 arranged oppositely to the substrate 10. The TFT array substrate 10 includes, for example, a quartz substrate, glass substrate, or silicon substrate, and the counter substrate 20 includes, for example, a glass substrate or quartz substrate.

As shown in FIG. 3, above the TFT array substrate 10, a pixel electrode 9a is provided, above which an orientation film 16, to which a predetermined orientation treatment such as the rubbing was performed, is provided. The pixel electrode 9a comprises a transparent conductive film, such as ITO (Indium Tin Oxide) film. The orientation film 16 includes an organic film such as a polyimide film.

On the other hand, above the counter substrate 20, the counter electrode 21 is provided over the entire surface, and an orientation film 22, to which a predetermined orientation treatment, such as the rubbing was performed, is provided on a downside of the substrate 20. The counter electrode 21 comprises a transparent conductive film, such as the ITO film. The orientation film 22 comprises an organic film such as the polyimide film.

Between such configured TFT array substrate 10 and counter substrate 20, where the pixel electrode 9a and counter electrode 21 are arranged such that they are opposed to each other, the liquid crystal as one example of the electro-optical material is filled in a space enclosed by a sealing material (described below), and thus a liquid crystal layer 50 is formed. The liquid crystal layer 50 is oriented to a predetermined direction by the orientation films 16 and 22 in a condition without any electric field applied from the pixel electrode 9a. The liquid crystal layer 50 includes a liquid crystal mixture containing, for example, one or several kinds of nematic liquid crystal. The sealing material is an adhesive including for example, a photo-curing resin or thermosetting resin, to bond the TFT array substrate 10 and counter substrate 20 together with their edges, and contains a gap member, such as a glass fiber or glass beads mixed therein to keep a distance between the two substrates in a predetermined value.

Further, under the TFT 30 for switching the pixel, a foundation insulating film 12 is provided. The foundation insulating film 12 has a function of an interlayer isolation of the TFT 30 from the underside shading film 11a, in addition, when the film 12 is formed over the entire surface of the TFT array substrate 10, the film 12 has another function of reducing or preventing a change of the characteristic of the TFT 30 to switch the pixel due to a coarse surface-roughness of the TFT array substrate 10 grown in polishing and a stain remained after cleaning.

In FIG. 3, the TFT 30 to switch the pixel has a LDD (Lightly Doped Drain) structure, and has the scan line 3a, the channel region 1a' of the semiconductor layer 1a in which a channel is formed by the electric field applied from the scan line 3a, an insulating film 2 including a gate insulating film to insulate the scan line 3a from the semiconductor layer 1a, the low-density source region 1b and low-density drain region 1c of the semiconductor layer 1a, and the high-density source region 1d and high-density drain region 1e of the semiconductor layer 1a.

On the scan line 3a, a first interlayer isolation film 41, in which a contact hole 81 communicating to the high-density source region 1d and a contact hole 83 communicating to the high-density drain region 1e are opened respectively, is formed.

On the first interlayer isolation film 41, the relay layer 71 and capacitor line 300 are formed, on which a second interlayer isolation film 42, in which the contact hole 81 and a contact hole 85 are opened respectively, is formed.

On the second interlayer isolation film 42, the data line 6a is formed, on which a third interlayer isolation film 43, in which the contact hole 85 communicating to the relay layer 71 is opened, is formed. The pixel electrode 9a is provided on a top surface of such configured third interlayer isolation film 43.

Particularly in the exemplary embodiment, on the counter substrate 20, a shading film 23 as an example of the first shading film is formed in an island pattern, in an area other than the opening area of each pixel.

As shown in FIG. 4, the shading film 23 has an overhanging portion 423 overhanging such that the portion defines a corner cutting in the opening area of each pixel corresponding to the pixel electrode 9a, substantially as the overhanging portion 401 in the capacitance line 300 or the overhanging portion 403 in the downside shading film 11a (refer to FIG. 2), in the crossing area where the data line 6a and scan line 3a cross with each other as viewed in a two-dimensional way. The channel region 1' is arranged within the crossing area.

By using the configuration, the shading film 23, together with the capacitor line 300 and data line 6a forming the upside shading film as above, can securely block the injection of the incident light from the counter substrate 20 side into the channel region 1a' and its adjacent region.

A material for the shading film 23, like the capacitor line 300, includes a metal, alloy, metal silicide, polysilicide, or a stack of them, including at least one of high-melting point metals, such as Ti, Cr, W, Ta, and Mo. Any other metal, such as Al, Ag, Au, or Cu, may be contained. The film 23 may also have a multilayer structure in which, for example, a photo absorbing polysilicon film and a photo reflective metal film are stacked. In this case, from a viewpoint of reducing an inside reflection light, it is advantageous to arrange the photo-absorbing polysilicon film on the downside (inside), and at the same time, from a viewpoint of reducing or preventing a temperature rise in the electro-optical apparatus, it is advantageous to arrange the light-reflective metal film on the upside (outside). Alternatively, the shading film 23 may be formed of a colored resin.

Various modified exemplary embodiments according to the two-dimensional pattern of the shading film 23 are described below with reference to FIG. 5 to FIG. 11.

According to the exemplary embodiment as described hereinbefore with reference to FIG. 1 to FIG. 4, the channel region 1a' and its adjacent region (that is, the low-density source region 1b and low-density drain region 1c shown in FIG. 2 and FIG. 3) are covered from the upside by the shading film 23 formed on the counter substrate 20 as an example of the first shading film, as well as the capacitance line 300 and the data line 6a as the upside shading film formed on the TFT array substrate 10. Therefore, shading against an incident light from a direction vertical to the TFT array substrate 10 can be enhanced by the shading film 23, as well as the capacitance line 300 and the data line 6a as the upside shading film. On the other hand, the channel region 1a' and its adjacent region are covered from the downside by the downside shading film 11a. Therefore, shading against the return light such as the back reflection light on the TFT array substrate 10, or the light, which is emitted from another electro-optical apparatus in a multiple-plate projector using plural number of electro-optical apparatus as light valves and passes through a composite optical system, can be enhanced by the downside shading film 11a.

The incident light contains an inclined light injected at oblique angle to the TFT array substrate 10. For example, an opticelement having an incident angle inclined about 10 to 15 degrees from the vertical direction is contained about 10% in the incident light. Further, the inclined light is reflected on a top surface of the downside shading film 11a formed on the TFT array substrate 10, and thus an inclined, inside reflection light is generated in that electro-optical apparatus. The inclined, inside reflection light is further reflected on another interface within the electro-optical apparatus, and thus an inclined multiple reflection light is generated. Particularly, the incident light is extremely strong compared with the return light, and thus the inclined, inside reflection light and multiple reflection light based on the incident light are also strong. In addition, the return light also contains the light injected at oblique angle, and the inside reflection light and multiple reflection light based on the return light are also generated.

On the contrary, particularly in this embodiment, the shading film 23 has an overhanging portion 423 defining the corner cutting in the opening area of each pixel in the crossing area (refer to FIG. 4). Further, the capacitor line 300 has the overhanging portion 401, and the downside shading film 11a has the overhanging portion 411 (refer to FIG. 2). The channel region 1a' is arranged in the center of the crossing area, and separated from the opening area of each pixel through which the incident light passes or the return light is injected with some distance because of presence of the corner cutting. Therefore, the shading performance for the channel region 1a' and its adjacent region is extremely improved by the presence of the overhanging portions 423, 401, and 411. That is, compared with a case without the overhanging portions 423, 401, and 411, the strong incident light and return light advancing at oblique angle, and the inside reflection light and multiple reflection light arising from the light at oblique angle, are effectively blocked to be injected to the channel region 1a' and its adjacent region.

As a result, the unevenness of display or the flicker due to the light-induced leakage current and variation in the TFT 30 can be efficiently reduced.

In addition, in the exemplary embodiment, the overhanging portions, which are symmetric vertically and horizontally, are provided in the four corners of the opening area respectively, as shown in FIG. 4 and FIG. 2. Therefore, the two-dimensional pattern of the opening area of each pixel is close to a circle or polygon shape compared with the case without the overhanging portions 401 and others. Accordingly, a well-balanced shading in the four sides can be performed for the TFT 30, and an excellent image display having a reduced light escape region and malfunctioned region can be performed in each opening area.

However, instead of providing the overhanging portions 423, 401, and 411 in all of the four corners in this way, the overhanging portions 423, 401, and 411 may be configured to be formed in one or plural number of corners, in which the bad orientation of the liquid crystal layer 50 is comparatively large, among the four corners. For example, the overhanging portions 423, 401, and 411 may be provided only in a corner where the bad orientation of the liquid crystal layer 50 is most significant in relation to the rubbing direction for the orientation films 16 and 22. Thus, by masking the bad orientation of the liquid crystal layer 50 while restraining an excessive extension of the unopened area, the contrast ratio can be increased efficiently.

In the exemplary embodiment, although the capacitor line 300 has the overhanging portion 401, and the downside shading film 11a has the overhanging portion 411, the overhanging portions can be omitted. Alternatively, either one of the overhanging portions may be provided. In each case, as long as the overhanging portion 423 exists in the shading film 23 above the counter substrate 20, the shading performance can be improved compared with a case without any overhanging portion provided.

On the other hand, according to the exemplary embodiment, since the storage capacitor 70 is also incorporated in the shading area defining the corner cutting, reduction of the opening area of each pixel can be reduced or efficiently avoided with the capacitance value being increased. Also, the drain electrode of the TFT 30 may be arranged in the shading area defining the corner cutting so that the opening area of each pixel is not reduced.

According to the exemplary embodiment as described hereinbefore with reference to FIG. 1 to FIG. 4, the TFT 30 to switch the pixel having the excellent transistor characteristic reduces the unevenness of display and the flicker, and thus an electro-optical apparatus that can provide a bright and high-definition or a high grade image display can be realized.

Although the downside shading film 11a is dropped to the fixed potential or set to a floating potential in the peripheral region in the exemplary embodiment described above, the downside shading film 11a may be connected to the capacitor line 300 within the image display area and dropped to the fixed potential. In this case, the downside shading film 11a can be functioned as a redundant interconnection for the capacitor line 300, and thus the resistance of the capacitor line 300 can be designed to be lowered. Alternatively, the downside shading film 11a is connected to the scan line 3a along the scan line 3a for one or plural number of pixels, and the downside shading film 11a may be formed in an approximately striped pattern divided for each scan line 3a. In this case, the downside shading film 11a can be functioned as a redundant interconnection for the scan line 3a, and thus the resistance of the scan line 3a can be designed to be lowered. In addition, the width of the shading area along the capacitor line 300 or scan line 3a can be narrowed by using the downside shading film 11a as the redundant interconnection in this way.

In the exemplary embodiment described above, a level difference formed in an area along the data line 6a and scan line 3a on the foundation surface of the pixel electrode 9a may be planarized by grooving the TFT array substrate 10, or by grooving the foundation insulating film 12, first interlayer isolation film 41, second interlayer isolation film 42, and third interlayer isolation film 43, and then burying the interconnection such as the data line 6a and the TFT 30 in the groove. Alternatively, that planarization may be done by polishing a level difference in the top surface of the third interlayer isolation film 43 and the second interlayer isolation film 42 with CMP (Chemical Mechanical Polishing), or by forming the film flat with the organic SOG (Spin On Glass).

(Modified Exemplary Embodiments)

First, various modified exemplary embodiments of the two-dimensional pattern of the shading film 23 above the counter substrate 20 usable in the above exemplary embodiment are described with reference to FIG. 5 to FIG. 13. FIG. 5 to FIG. 11 are partial plan views showing modified exemplary embodiments according to the two-dimensional pattern of the shading film 23 at the counter substrate 20 side, which are usable in the exemplary embodiment. FIG. 12 schematically shows a relationship between the passage of the incident light and various shading films according to the exemplary embodiment of FIG. 4 and the modified exemplary embodiments of FIG. 5 to FIG. 7, and FIG. 13 schematically shows a relationship between the passage of the incident light and various shading films according to the modified exemplary embodiments of FIG. 8 to FIG. 11. In FIG. 5 to FIG. 13, components equal to those shown in FIG. 1 to FIG. 4 are marked with equal reference symbols, and description of the components is omitted.

Figure 5:
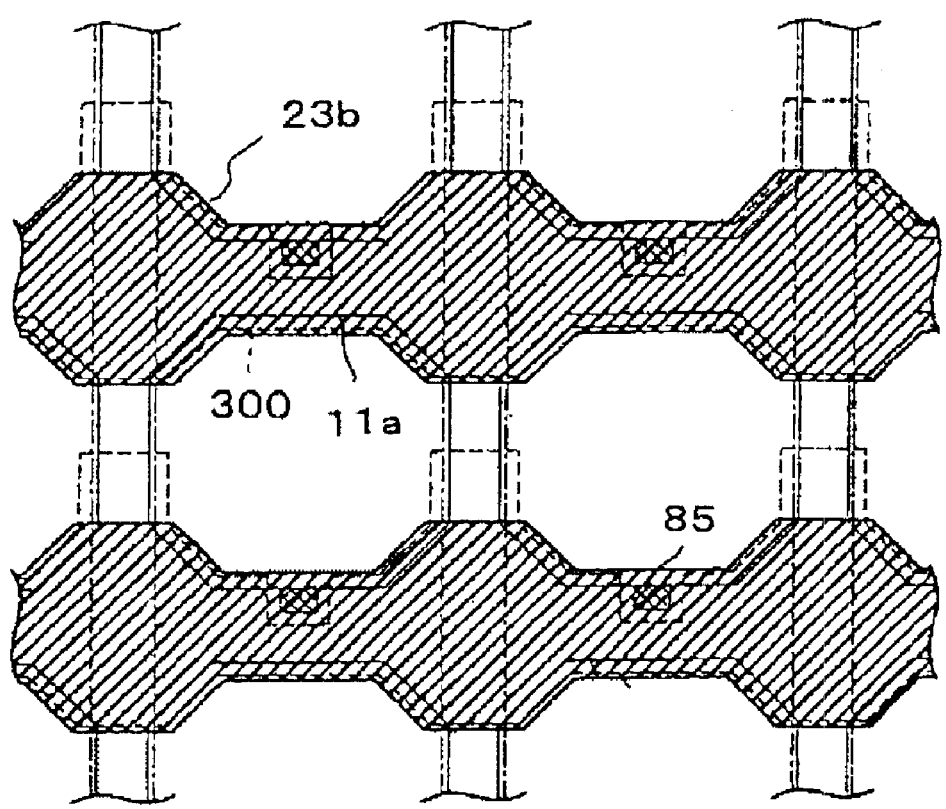
FIG. 5 is a partial plan view showing a modified exemplary embodiment according to the two-dimensional pattern of the shading film at the counter substrate side, and usable in the exemplary embodiment.
Figure 6:
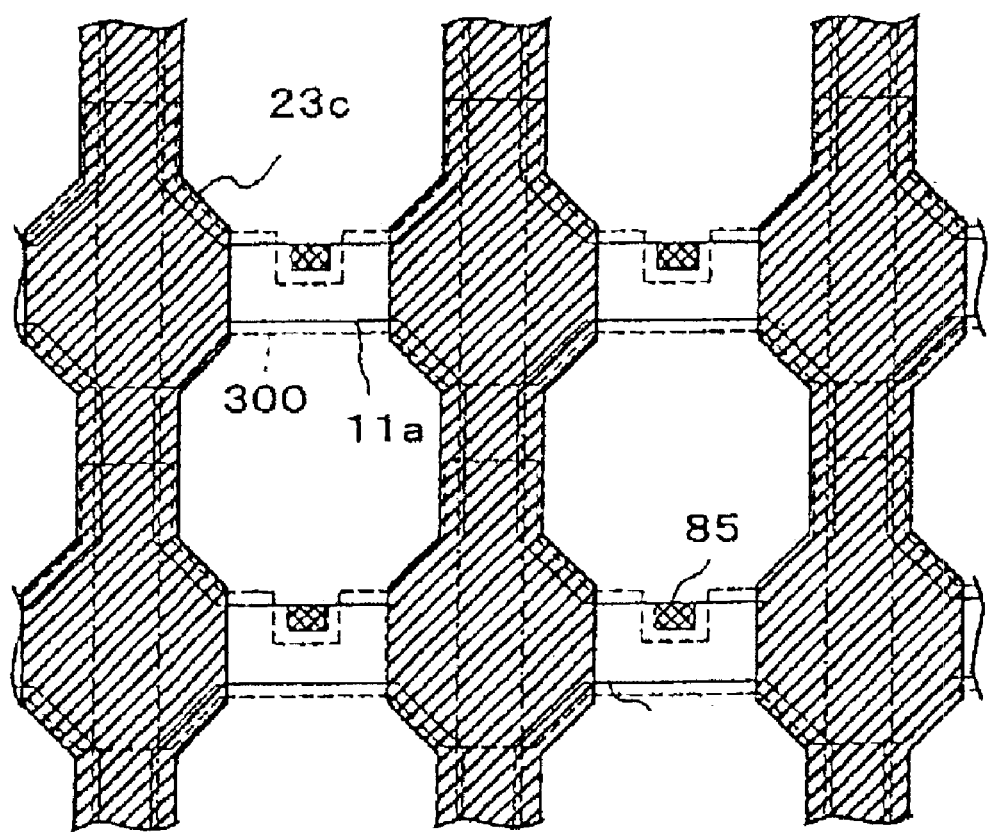
FIG. 6 is a partial plan view showing a modified exemplary embodiment according to the two-dimensional pattern of the shading film at the counter substrate side, and usable in the exemplary embodiment.
Figure 7:
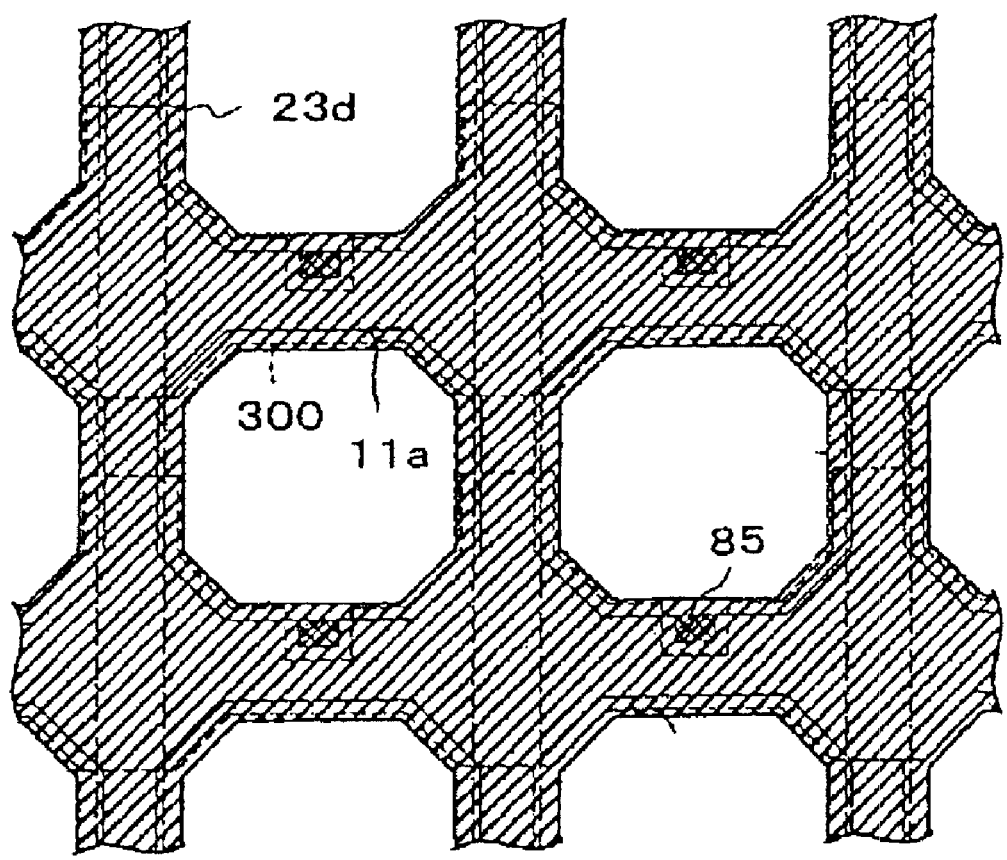
FIG. 7 is a partial plan view showing a modified exemplary embodiment according to the two-dimensional pattern of the shading film at the counter substrate side, and usable in the exemplary embodiment.

In the exemplary embodiment shown in FIG. 4 and the modified exemplary embodiments of FIG. 5 to FIG. 7, the shading films 23 and 23b to 23d above the counter substrate 20 are formed somewhat larger at least partially than the lattice-pattern upside shading film (that is, the capacitor line 300 and data line 6a defining the lattice-pattern shading area) formed above the TFT array substrate 10, and configured such that the films define the unopened area of each pixel at least partially. In each of the modified exemplary embodiments, a shading film is provided as the overhanging portion 423 in a region opposed to the overhanging portion 401.

That is, in the exemplary embodiment of FIG. 4, the shading film 23 is provided in the island pattern above the counter substrate 20 only in the crossing area within the shading area where the upside shading film exists. Use of the shading film 23 can remarkably enhance the shading performance for the TFT 30 to switch the pixel in the vicinity of the crossing area. In addition, the unopened area of each pixel can be defined in the crossing area.

In the modified exemplary embodiment of FIG. 5, the shading film 23b is provided in an approximately lateral stripe pattern above the counter substrate 20 only in the crossing area and a band region along the scan line 3a within the shading area where the upside shading film exists. The use of the shading film 23b can remarkably enhance the shading performance for the TFT 30 for switching the pixel in the vicinity of the crossing area and the region along the scan line 3a. In addition, the unopened area of each pixel can be defined in the crossing area and the band area along the scan line 3a.

In the modified exemplary embodiment of FIG. 6, the shading film 23c is provided in an approximately longitudinal stripe pattern above the counter substrate 20 only in the crossing area and a region along the data line 6a within the shading area where the upside shading film exists. The use of the shading film 23c can remarkably enhance the shading performance for the TFT 30 to switch the pixel in the vicinity of the crossing area and the region along the data line 6a. In addition, the unopened area of each pixel can be defined in the crossing area and the region along the data line 6a.

In the modified exemplary embodiment of FIG. 7, the shading film 23d is provided in an approximate lattice pattern above the counter substrate 20 in an area where the upside shading film exists. The use of the shading film 23d can remarkably enhance the shading performance for the TFT 30 to switch the pixel in the entire unopened lattice-pattern region. In addition, the unopened area in that lattice pattern can be defined.

As above, in the exemplary embodiment of FIG. 4 and the modified exemplary embodiments of FIG. 5 to FIG. 7, the shading films 23 and 23b to 23d above the counter substrate 20 defines the unopened lattice-pattern area at least partially. On the contrary, in the modified exemplary embodiments of FIG. 8 to FIG. 11, shading films 23' and 23b' to 23d' above the counter substrate 20 are formed somewhat smaller than such upside shading films, and configured such that the films do not define the unopened area. In each of the modified exemplary embodiments, in the area opposed to the overhanging portion 401, a shading film is provided as an overhanging portion 423' that is somewhat smaller than the portion 401.

Figure 8:
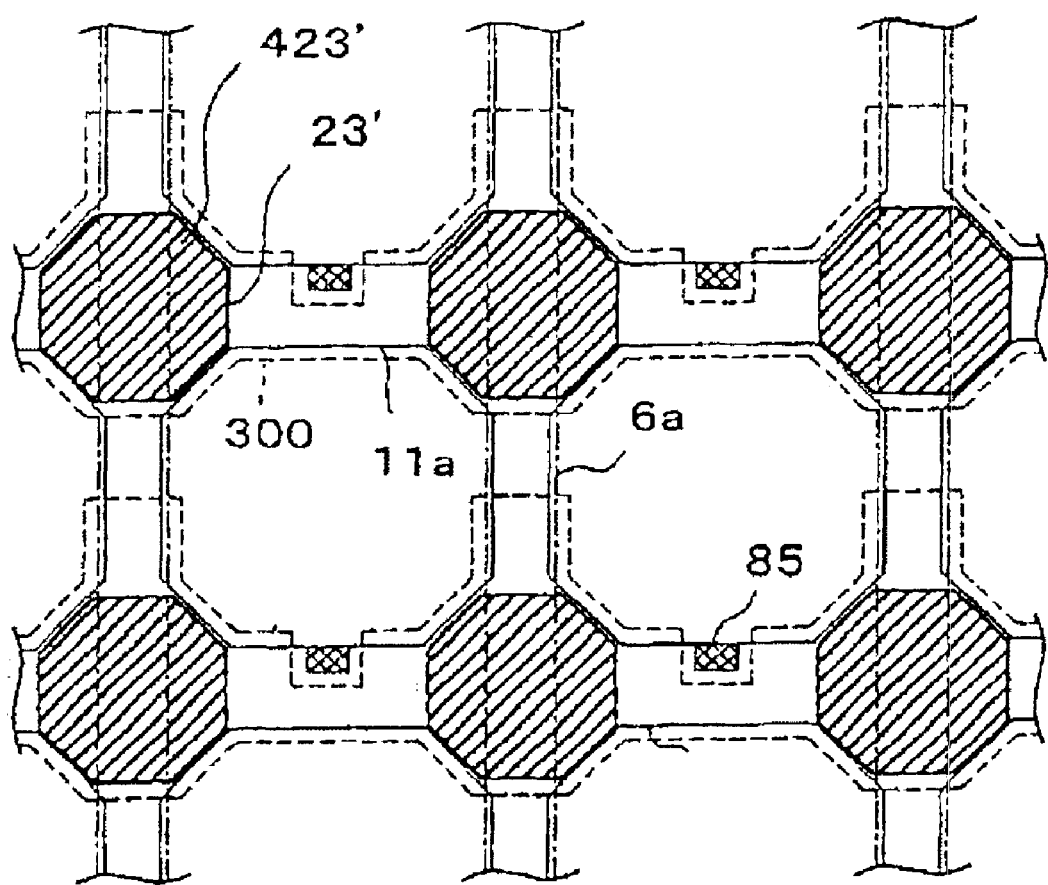
FIG. 8 is a partial plan view showing a modified exemplary embodiment according to the two-dimensional pattern of the shading film at the counter substrate side, and usable in the exemplary embodiment.

That is, in the modified exemplary embodiment of FIG. 8, the shading film 23' is provided in an island pattern above the counter substrate 20 only in the crossing area within the shading area where the upside shading film (that is, the capacitor line 300 and the data line 6a) exists. The use of the shading film 23' can remarkably enhance the shading performance for the TFT 30 to switch the pixel in the vicinity of the crossing area. Moreover, since the overhanging portion 423' of the shading film 23' is formed somewhat smaller than the overhanging portion 401, it is effectively reduced or avoided that the shading film 23' reduces the opening area due to a mechanical misalignment between the TFT array substrate 10 and counter substrate 20 during production.

Figure 9:
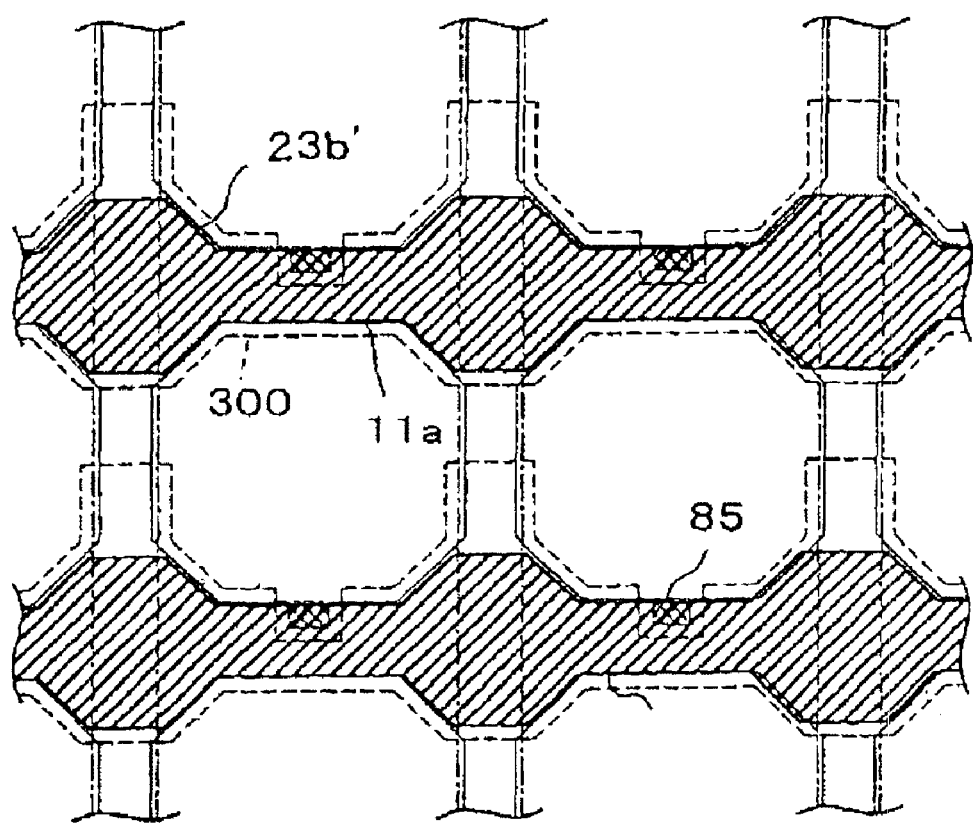
FIG. 9 is a partial plan view showing a modified exemplary embodiment according to the two-dimensional pattern of the shading film at the counter substrate side, and usable in the exemplary embodiment.

In the modified exemplary embodiment of FIG. 9, the shading film 23b' is provided in the approximately lateral stripe pattern above the counter substrate 20 only in the crossing area and the region along the scan line 3a within the shading area where the upside shading film exists. The use of the shading film 23b' can remarkably enhance the shading performance for the TFT 30 to switch the pixel in the vicinity of the crossing area and the region along the scan line 3a. Moreover, since the shading film 23b' is formed somewhat smaller than the overhanging portion 401 and capacitor line 300, it is reduced or effectively avoided that the shading film 23b' reduces the opening area due to the mechanical misalignment between the TFT array substrate 10 and counter substrate 20 during production.

Figure 10:
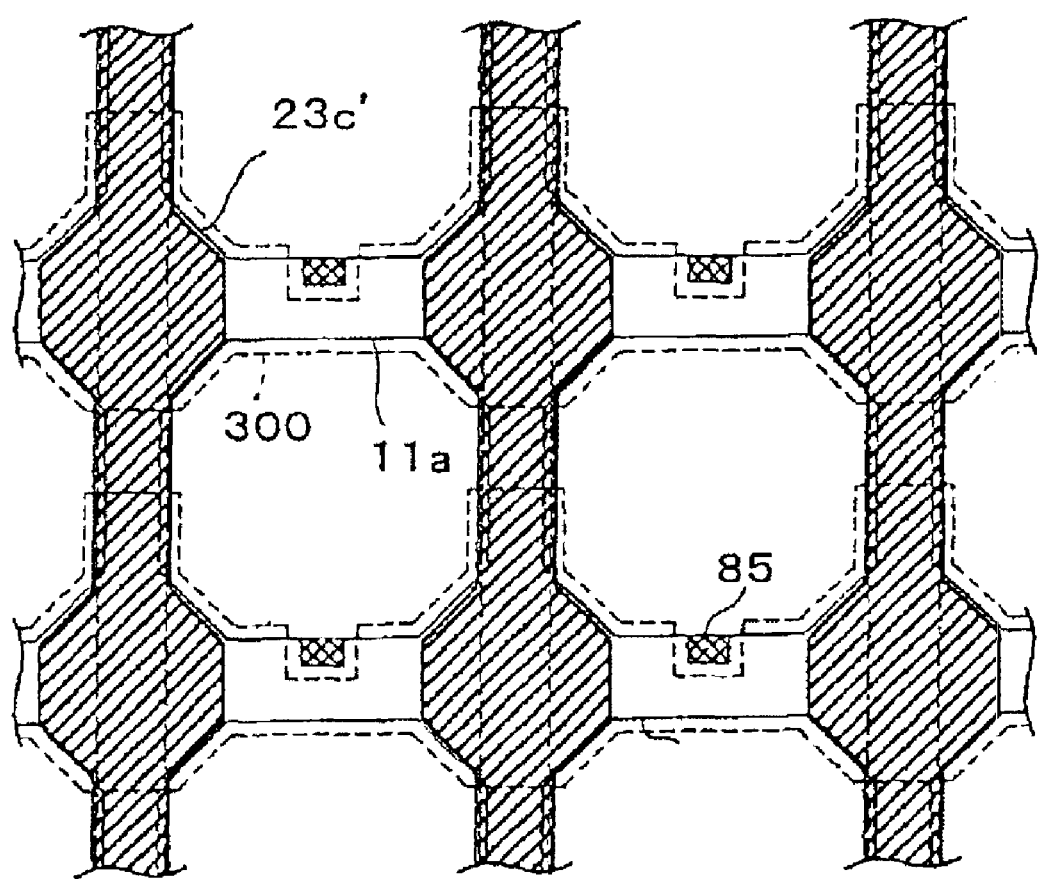
FIG. 10 is a partial plan view showing a modified exemplary embodiment according to the two-dimensional pattern of the shading film at the counter substrate side, and usable in the exemplary embodiment.

In the modified exemplary embodiment of FIG. 10, the shading film 23c' is provided in the approximately longitudinal striped pattern above the counter substrate 20 only in the crossing area and the region along the data line 6a within the shading area where the upside shading film exists. The use of the shading film 23c' can remarkably enhance the shading performance for the TFT 30 for switching the pixel in the vicinity of the crossing area and the region along the data line 6a. Moreover, since the shading film 23c' is formed somewhat smaller than the overhanging portion 401 and data line 6a, it is effectively avoided that the shading film 23c' reduces the opening area due to the mechanical misalignment between the TFT array substrate 10 and counter substrate 20 during production.

Figure 11:
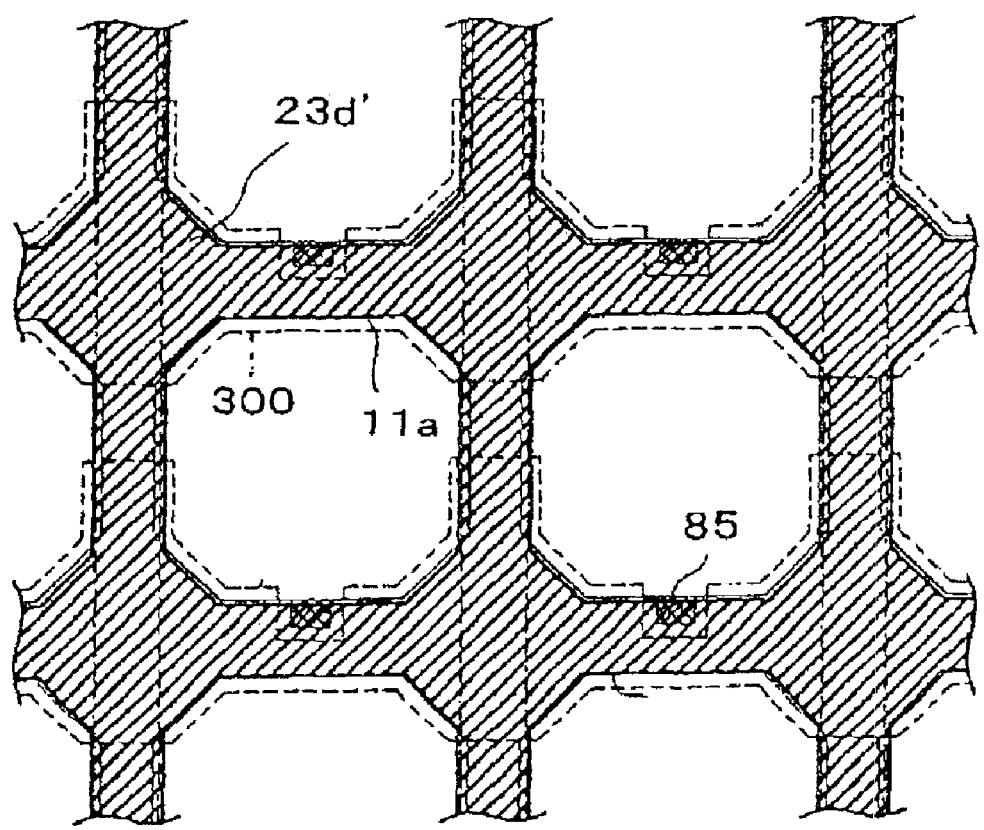
FIG. 11 is a partial plan view showing a modified exemplary embodiment according to the two-dimensional pattern of the shading film at the counter substrate side, and usable in the exemplary embodiment.
Figure 12:
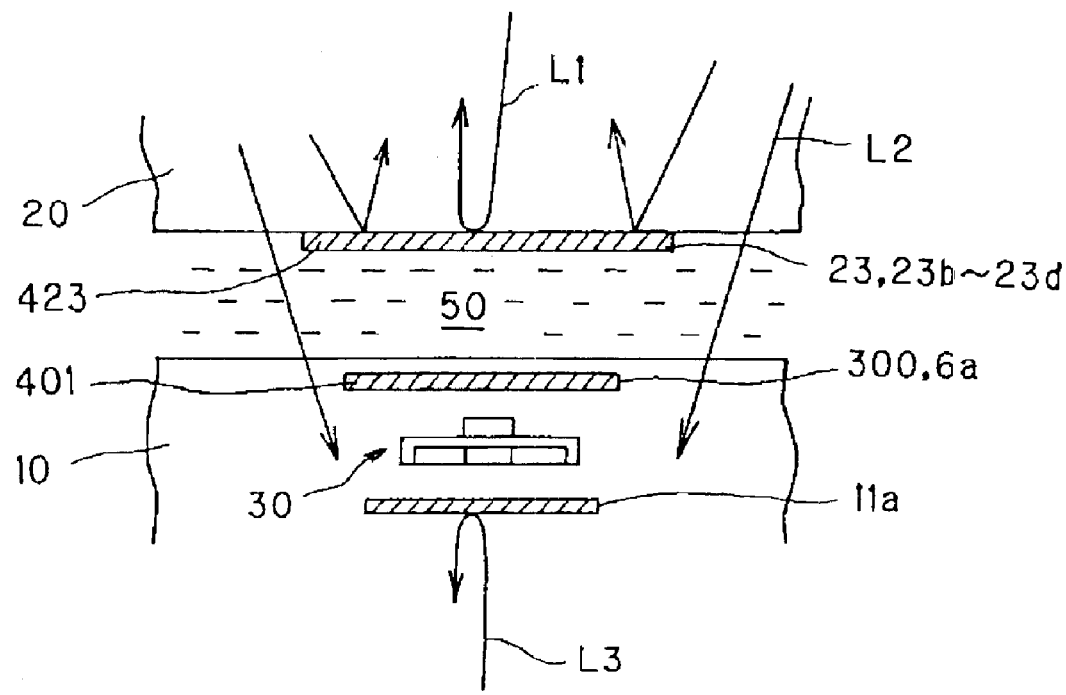
FIG. 12 is a schematic cross-sectional view showing a relationship between a passage of an incident light and various shading films according to the exemplary embodiment of FIG. 4 and modified exemplary embodiments from FIG. 5 to FIG. 7.

In the modified exemplary embodiment of FIG. 11, the shading film 23d' is provided in an approximately lattice pattern above the counter substrate 20 in the area where the upside shading film exists. The use of the shading film 23d' can remarkably enhance the shading performance for the TFT 30 to switch the pixel in all of the unopened lattice-pattern area. Moreover, since the shading film 23d' is formed somewhat smaller than the overhanging portion 401, as well as the capacitor line 300 and data line 6a, it is effectively reduced or avoided that the shading film 23d' reduces the opening area due to the mechanical misalignment between the TFT array substrate 10 and counter substrate 20 during production.

Here, as shown in FIG. 12, in the cases of the exemplary embodiment of FIG. 4 and the modified exemplary embodiments of FIG. 5 to FIG. 7, the shading film above the counter substrate 20 (that is, the shading films 23 and 23b to 23d) is somewhat larger than the shading film above the TFT array substrate 10 (that is, the capacitance line 300 and data line 6a, as well as downside shading film 11a). Thus, the shading for the TFT 30 against a vertically incident light L1 and obliquely incident light L2 can be substantially achieved by the shading film above the counter substrate 20. The return light L3 can be also shaded by the downside shading film 11a. In addition, even if some misalignment occurs between the two substrates, as viewed in a two-dimensional way, the shading film above the TFT array substrate 10 is not likely to protrude from the shading film above the counter substrate 20 and reduce the opening area of each pixel.

Figure 13:
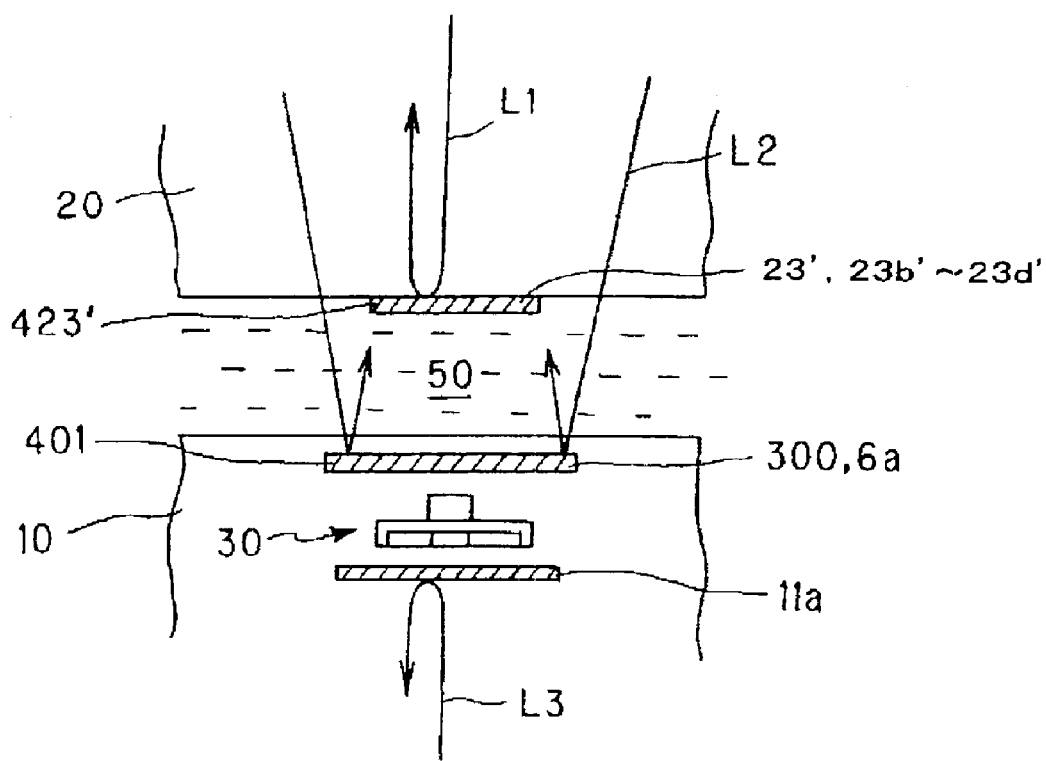
FIG. 13 is a schematic cross-sectional view showing a relationship between a passage of an incident light and various shading films according to the modified exemplary embodiments from FIG. 8 to FIG. 11.

On the other hand, as shown in FIG. 13, in the cases of the modified exemplary embodiments of FIG. 8 to FIG. 11, the shading film above the counter substrate 20 (that is, the shading films 23' and 23b' to 23d') is somewhat smaller than the shading film above the TFT array substrate 10 (that is, the capacitor line 300 and data line 6a, as well as the downside shading film 11a). Thus, the shading for the TFT 30 against the vertically incident light L1 and obliquely incident light L2 is achieved by the shading film above the counter substrate 20 and the shading film above the TFT array substrate 10. In addition, even if some misalignment exists between the two substrates, as viewed in a two-dimensional way, the shading film above the counter substrate 20 is not likely to protrude from the shading film above the TFT array substrate 10 and reduce the opening area of each pixel.

As described above with reference to FIG. 4 to FIG. 13, in the exemplary embodiments, various figures of the overhanging portions of the capacitor line 300, relay layer 402, and downside shading film 11a, and the corner cutting of the pixel electrode 9a can be used, and various different combinations of them are possible. Which combination to be used is given from the most preferable combination determined experimentally or experientially in view of a practical specification of the apparatus, and then the combination is preferably used.

Figure 14:
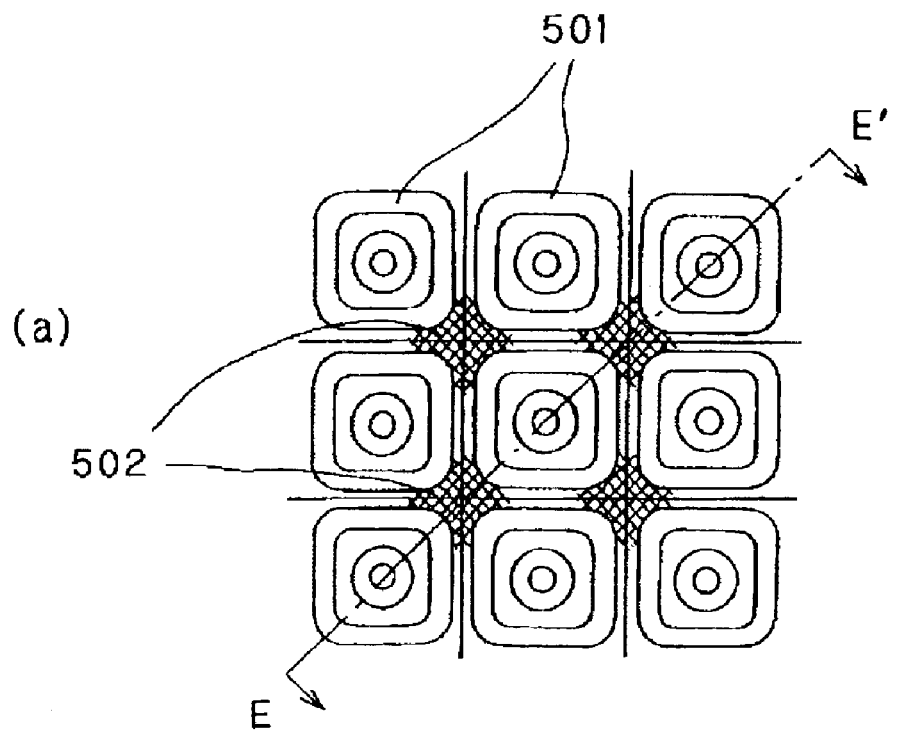
FIG. 14($a$) is a partially enlarged plan view showing a micro-lens incorporated in a counter substrate 20, and FIG. 14($b$) is a cross-sectional view taken along plane E–E' of FIG. 14($a$)
Figure 14:
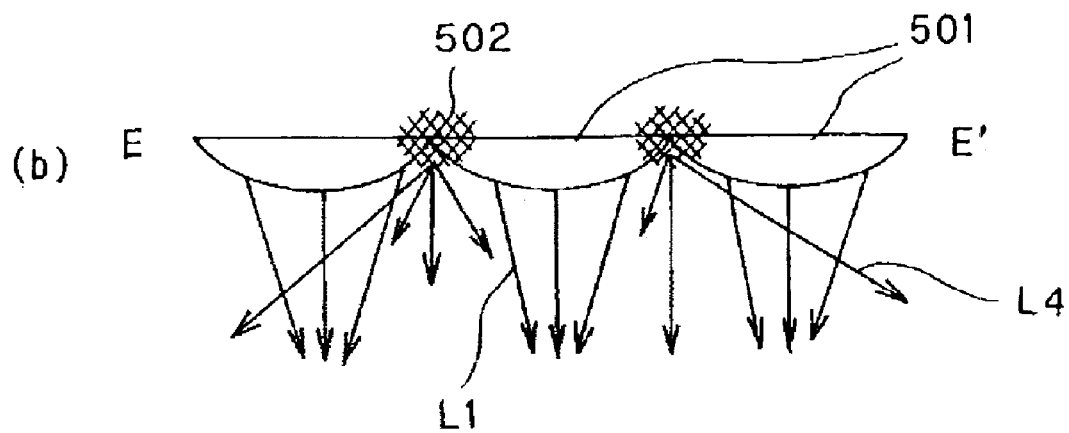
Figure 15:
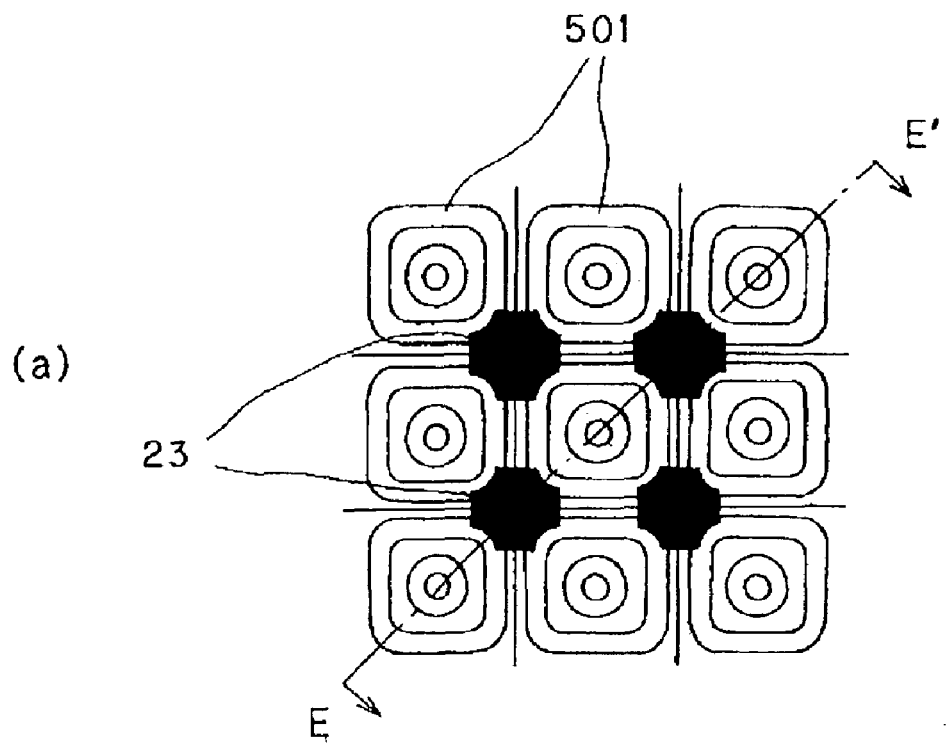
FIG. 15($a$) is a partially enlarged plan view showing a relationship between the micro-lens of FIGS. 14($a$) and 14($b$) and the shading film at the counter substrate side, and FIG. 15($b$) is a cross-sectional view taken along plane E–E' of FIG. 15($a$)
Figure 15:
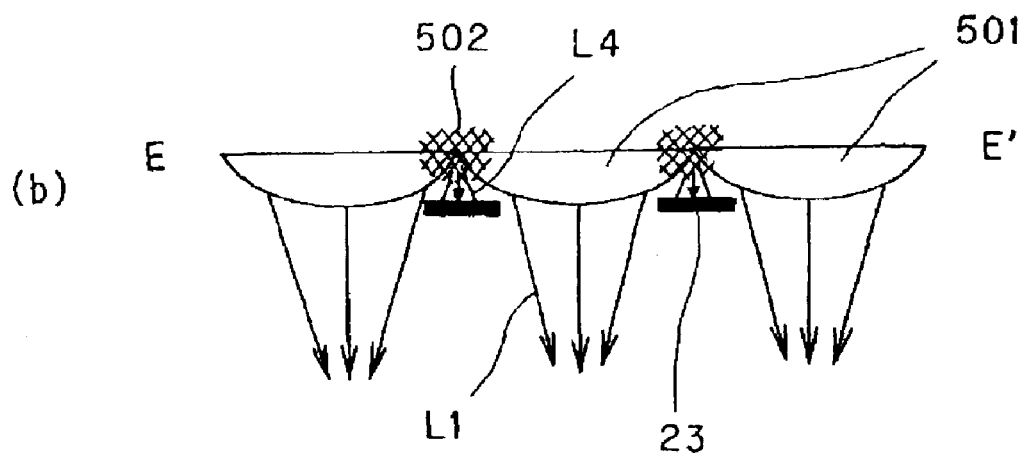

Next, a modified exemplary embodiment using a micro-lens is described with reference to FIGS. 14(a)–15(b). FIG. 14(a) is a partially enlarged plan view showing a micro-lens incorporated in the counter substrate 20, and FIG. 14(b) is a cross-sectional view taken along plane E–E' of FIG. 14(a). FIG. 15(a) is a partially enlarged plan view showing a relationship between the micro-lens of FIGS. 14(a) and 14(b) and the shading film 23 (refer to FIG. 4), and FIG. 15(b) is a cross-sectional view taken along plane E–E' of FIG. 15(a).

The modified exemplary embodiment is an exemplary embodiment where the micro-lens is incorporated within the counter substrate 20, such that the micro-lens corresponds one to one to each pixel, or the micro-lens is mounted on the top or bottom surface of the substrate 20 together with a cover glass, such that the micro-lens corresponds one to one to each pixel.

As shown in FIGS. 14(a) and 14(b), the micro-lens 501 is a small convex lens for converging light with the center of each pixel as a lens center. Therefore, in a vicinity of the center of the micro-lens 501 having a surface height shown by a contour in FIG. 14(a), the incident light L1 can be appropriately converged as shown in FIG. 14(b). On the other hand, in the gap region 501 (shown as a hatching area in the figure) of the micro-lens 501 adjacent vertically and horizontally with each other as shown in FIG. 14(a), according to the property of the lens, it is hard or impossible to converge the incident light appropriately. Thus, as shown in FIG. 14(b), the light cannot be converged appropriately and a stray light L4 is generated.

However, as shown in FIG. 15(a), in the exemplary embodiment, the gap region 502 is masked by the shading film 23 having the overhanging portion 423. Thus, as shown in FIG. 15(b), it is possible to reduce or prevent most of the stray light L4 mixing in the incident light L1. At that time, since the micro-lens 501 converges the incident light L1 in the opening area of each pixel in an approximately circular pattern, it is advantageous that the overhanging portion 423 is formed in the four corners of the opening area of each pixel to make the opening area of each pixel to be close to a circle.

As described with reference to FIGS. 14(a)–15(b), according to the exemplary embodiment, still brighter image display can be achieved by enhancing the usability efficiency of light using the micro-lens 501. At the same time, the problem due to the gap region 502, in which the lens characteristic of the micro-lens 501 is inferior, can be solved by the shading film 23 having the overhanging portion 423, therefore, an extremely high-grade image display can be eventually achieved.

As described above, the overhanging portion of the shading film provided above the counter substrate has a shading area to shade the corner portion of the pixel electrode. The overhanging portion of the shading film provided above the counter substrate covers another shading film in the crossing area of the scan line and data line, or is formed smaller than the another shading film in the crossing area.

(General Configuration of Electro-Optical Apparatus)

Figure 16:
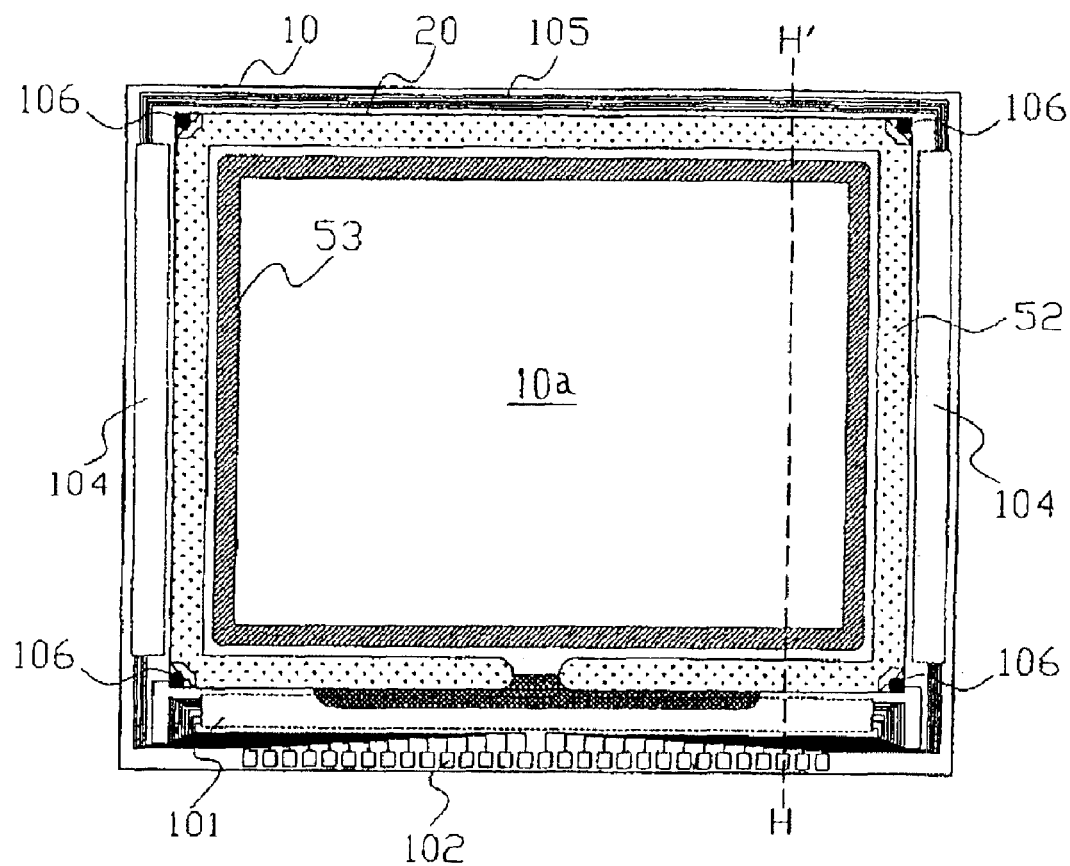
FIG. 16 is a plan view of TFT array substrate in the electro-optical apparatus of the exemplary embodiment together with respective components formed thereon, as viewed from the counter substrate side.
Figure 17:
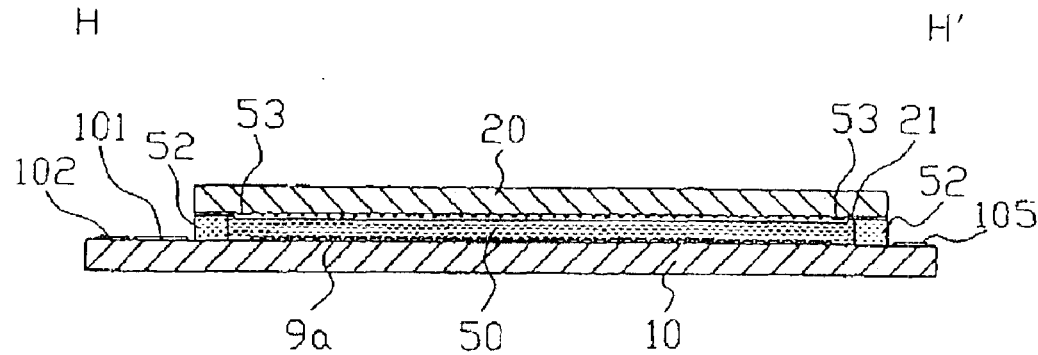
FIG. 17 is a cross-sectional view taken along plane H–H' of FIG. 16.

A general configuration of the electro-optical apparatus in each exemplary embodiment configured as above is described with reference to FIG. 16 and FIG. 17. FIG. 16 is a plan view of the TFT array substrate 10 together with respective components formed thereon, as viewed from the counter substrate 20 side, and FIG. 17 is a cross-sectional view taken along plane H–H' of FIG. 16.

In FIG. 16, on the TFT array substrate 10, a sealing member 52 is provided along edges of the substrate, and a shading film 53 is provided as a frame defining a circumference of an image display area 10a, in parallel to the inside of the sealing member. In an area outside of the sealing member 52, a data-line driving circuit 101 to drive the data line 6a by supplying the image signal to the data line 6a at a predetermined timing and a connection terminal 102 for outer circuit are provided along one side of the TFT array substrate 10, and a scan-line driving circuit 104 to drive the scan line 3a by supplying the scan signal to the scan line 3a in a predetermined timing is provided along two sides adjacent to the one side. When delay of the scan signal supplied to the scan line 3a, is not a problem, the scan-line driving circuit 104 may be provided only at one side. In addition, the data-line driving circuit 101 may be arranged in both sides along the sides of the image display area 10a. Further, on the remained one side of the TFT array substrate 10, plural number of interconnections 105 for connecting between the scan-line driving circuits 104 provided on both sides of the image display area 10a are provided. In at least one of the corner portions of the counter substrate 20, a conduction member 106 is provided for electrically connecting between the TFT array substrate 10 and counter substrate 20. As shown in FIG. 17, the counter substrate 20 having an approximately same profile as that of the sealing member 52 shown in FIG. 16 is bound to the TFT array substrate 10 by that sealing member 52.

Above the TFT array substrate 10, in addition to the data-line driving circuit 101 and scan-line driving circuit 104, a sampling circuit to apply the image signal to the plural number of data lines 6a at a predetermined timing, a pre-charge circuit to supply a pre-charge signal at a predetermined voltage level prior to the image signal to the plural number of data lines 6a respectively, and an inspection circuit to perform a quality or defect inspection for that electro-optical apparatus during production or before shipping, may be formed.

In the exemplary embodiments described above with reference to FIG. 1 to FIG. 17, instead of providing the data-line driving circuit 101 and scan-line driving circuit 104 above the TFT array substrate 10, the circuits may be connected electrically and mechanically to a driver LSI mounted on TAB (Tape Automated bonding) substrate via an anisotropic conductive film provided on a periphery of the TFT array substrate 10. On a side of the counter substrate 20 to which a projection light is injected, and on a side of the TFT array substrate 10 from which an emission light is emitted, a polarizing film, a retardation film, and a polarizing plate are arranged in a predetermined direction depending on an operation mode such as TN (Twisted Nematic) mode, STN (Super Twisted Nematic) mode, VA (Vertically Aligned) mode, or PDLC (Polymer Dispersed Liquid Crystal) mode, or according to whether the mode is the normally white mode or the normally black mode.

The electro-optical apparatus in the exemplary embodiments described above is used for the projector, therefore three electro-optical apparatus are used for the light valves for RGB respectively, and each color of light separated through a dichroic mirror for RGB color separation is injected to each light valve as the projection light. Therefore, in each exemplary embodiment, a color filter is not provided above the counter substrate 20. However, an RGB color filter may be formed above the counter substrate 20 in a predetermined area opposed to the pixel electrode 9a together with a protection film of the filter. This enables application of the electro-optical apparatus in each exemplary embodiment to a direct viewing type or reflection type of color electro-optical apparatus other than a projector. Alternatively, a color filter layer may be formed with a color resist under the pixel electrode 9a opposing to RGB above the TFT array substrate 10. This enables realization of a bright electro-optical apparatus by enhancing a convergence efficiency of the incident light.

Still further, by depositing multiple layers of interference layer including layers having a different refractive index above the counter substrate 20, a dichroic filter which produces the RGB colors using the interference of light may be formed. The counter substrate with the dichroic filter can realize a brighter color electro-optical apparatus.

(Exemplary Embodiment of Electronic Equipment)

Next, regarding an exemplary embodiment of a projection type of color display apparatus as an example of the electronic equipment using the electro-optical apparatus described above in detail as the light valve, a general configuration of it, particularly an optical configuration is described. Here, FIG. 18 is a schematic cross-sectional view of the projection type of color display apparatus.

Figure 18:
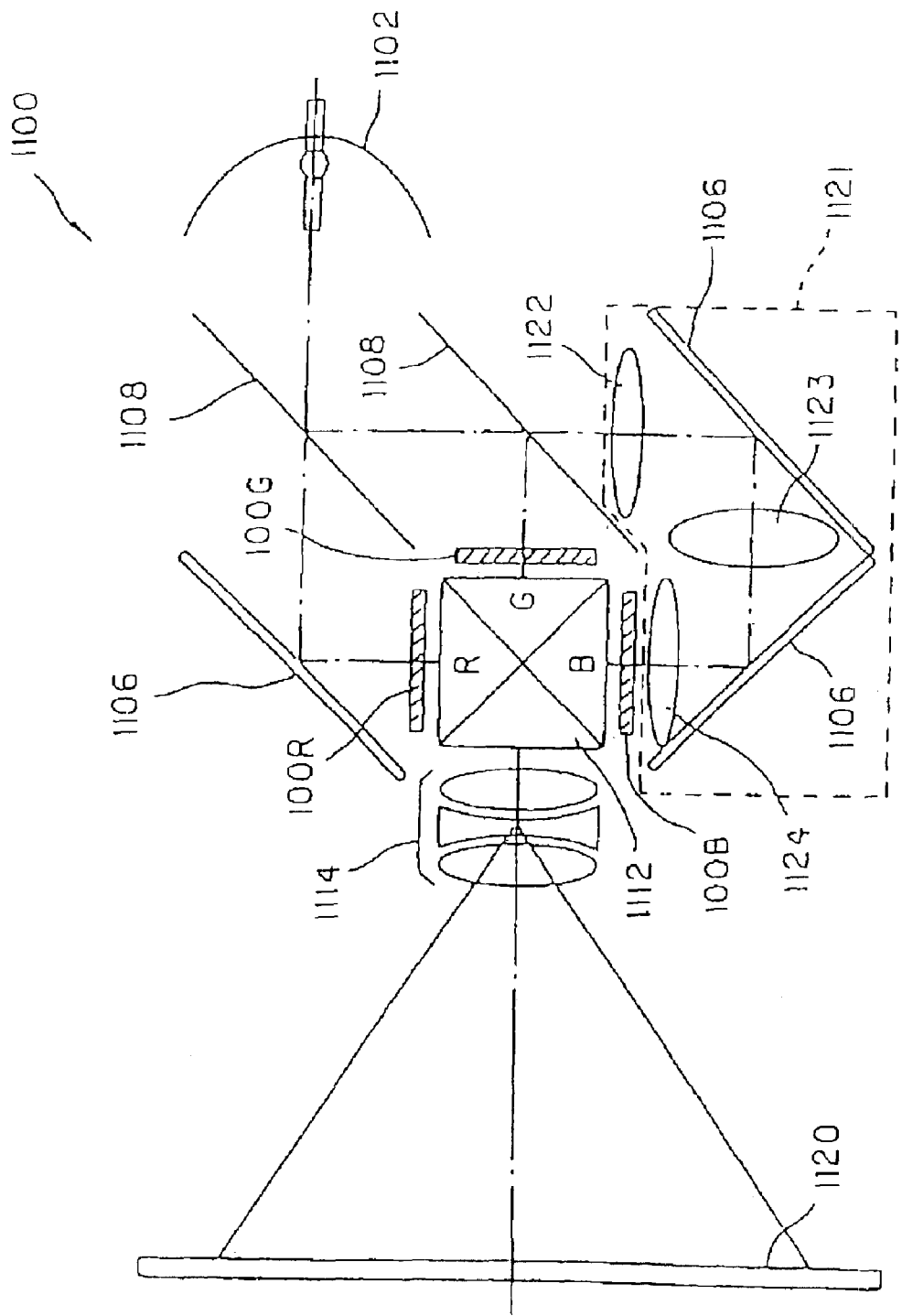
FIG. 18 is a schematic cross-sectional view showing a color liquid crystal projector as an example of an exemplary embodiment of the electronic equipment of the invention.

In FIG. 18, a liquid crystal projector 1100 as an example of projection color display apparatus in this exemplary embodiment is configured as a projector, in which three liquid-crystal modules including a liquid crystal apparatus 100 having a driving circuit mounted on the TFT array substrate are prepared and used as light valves 100R, 100G, and 100B for RGB, respectively. In the liquid crystal projector 1100, when a projection light is emitted from a lamp unit 1102 of white-light source such as a metal halide lamp, the light is divided into optic elements R, G, B corresponding to the three primary colors of RGB by three mirrors 1106 and two dichroic mirrors 1108, and respective optic elements are introduced to the light valves 100R, 100G, and 100B corresponding to respective colors. Particularly at that time, the light B is introduced through a relay lens system 1121 including an incident lens 1122, a relay lens 1123 and emission lens 1124 in order to reduce or prevent a light loss due to a long optical path. The optic elements corresponding to the three primary colors modulated by the light valves 100R, 100G, and 100B respectively are synthesized again by a dichroic prism 1112, then projected on a screen 1120 through a projection lens 1114 as a color image.

The invention is not limited to the above exemplary embodiments, and can be altered properly without departing from the claims and the scope or idea of the invention read out generally from the specification, and in addition, the electro-optical apparatus and electronic equipment accompanied with such alteration are also included within the technical scope of the invention.

What is claimed is:

1. An electro-optical apparatus, comprising:
   a pair of first and second substrates;
   an electro-optical material sandwiched between the pair of first and second substrates;
   a pixel electrode formed above the first substrate;
   a thin film transistor to switch and control the pixel electrode;
   a data line to supply an image signal to the thin film transistor;
   a scan line which supplies a scan signal to the thin film transistor and crosses with the data line; and
   a first shading film covering at least a channel region of a semiconductor layer forming the thin film transistor from an upside, the first shading film being formed above the second substrate, the first shading film having an overhanging portion overhanging such that the portion defines a corner cutting in an opening area of each pixel corresponding to the pixel electrode in a crossing area where the data line and the scan line cross with each other as viewed two-dimensionally, the channel region being arranged within the crossing area.

2. The electro-optical apparatus according to claim 1, the channel region being arranged in a center of the crossing area.

3. The electro-optical apparatus according to claim 1, further including a micro-lens arranged oppositely to the pixel electrode above the second substrate, the first shading film being formed in the area opposed to the crossing area.

4. The electro-optical apparatus according to claim 1, the first shading film being formed in an island pattern individually in the crossing area.

5. The electro-optical apparatus according to claim 1, the first shading film being formed in a striped pattern region extending along the scan line or the data line including the crossing area.

6. The electro-optical apparatus according to claim 1, the first shading film being formed in a lattice pattern region extending along the scan line and the data line including the crossing area.

7. The electro-optical apparatus according to claim 1, further including an upside shading film covering at least the channel region from an upside, the upside shading film being provided above the first substrate.

8. The electro-optical apparatus according to claim 7, the upside shading film having the overhanging portion overhanging such that the portion defines the corner cutting in the crossing area.

9. The electro-optical apparatus according to claim 7, a two-dimensional pattern of the first shading film covering a two-dimensional pattern of the upside shading film in the crossing area.

10. The electro-optical apparatus according to claim 7, the two-dimensional pattern of the first shading film being formed within the two-dimensional pattern of the upside shading film in the crossing area.

11. The electro-optical apparatus according to claim 1, further including a downside shading film covering at least the channel region from a downside, the downside shading film being provided above the first substrate.

12. The electro-optical apparatus according to claim 11, the downside shading film having an overhanging portion overhanging such that the portion defines the corner cutting in the crossing area.

13. The electro-optical apparatus according to claim 1, the overhanging portion being provided at least in one or plural number of corners where malfunction of the electro-optical material is comparatively serious among four corners of the opening area.

14. The electro-optical apparatus according to claim 1, further including overhanging portions, which are symmetric vertically and horizontally, provided in four corners of the opening area respectively.

15. An electro-optical apparatus, comprising:
   a pair of first and second substrates;
   an electro-optical material sandwiched between the pair of first and second substrates;
   a pixel electrode formed above the first substrate;
   a thin film transistor to switch and control the pixel electrode;
   a data line to supply an image signal to the thin film transistor;
   a scan line which supplies a scan signal to the thin film transistor, and crosses with the data line above the first substrate; and
   a first shading film covering at least a channel region of a semiconductor layer forming the thin film transistor from an upside, the first shading film being formed above the second substrate, the first shading film having a shading region to shade the corner of the pixel electrode in the crossing area where the data line and the scan line cross with each other as viewed two-dimensionally, the channel region being arranged within the crossing area.

16. An electronic equipment, comprising:
   a pair of first and second substrates;
   an electro-optical material sandwiched between the pair of first and second substrates;
   a pixel electrode formed above the first substrate;
   a thin film transistor to switch and control the pixel electrode;
   a data line to supply an image signal to the thin film transistor;
   a scan line which supplies a scan signal to the thin film transistor and crosses with the data line above the first substrate; and
   a first shading film covering at least a channel region of a semiconductor layer forming the thin film transistor from an upside, the first shading film being formed above the second substrate, the first shading film having an overhanging portion overhanging such that the portion defines a corner cutting in the opening area of each pixel corresponding to the pixel electrode in the crossing area where the data line and the scan line cross with each other as viewed two-dimensionally, the channel region being arranged within the crossing area.

* * * * *